(12) United States Patent
Sinai

(10) Patent No.: US 8,433,430 B2
(45) Date of Patent: *Apr. 30, 2013

(54) CELLULAR WIRELESS TELEPHONE AND AUDIO CODEC THEREFOR

(75) Inventor: David Sinai, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 146 days.

This patent is subject to a terminal disclaimer.

(21) Appl. No.: 12/833,222

(22) Filed: Jul. 9, 2010

(65) Prior Publication Data

US 2010/0317397 A1      Dec. 16, 2010

Related U.S. Application Data

(63) Continuation of application No. 11/318,600, filed on Dec. 28, 2005, now Pat. No. 7,765,019.

(30) Foreign Application Priority Data

Nov. 26, 2005 (GB) .................................. 0524099.9

(51) Int. Cl.
*G06F 17/00* (2006.01)

(52) U.S. Cl.
USPC ............................................ 700/94; 381/119

(58) Field of Classification Search ............... 700/94; 381/119
See application file for complete search history.

(56) References Cited

U.S. PATENT DOCUMENTS

| | | | |
|---|---|---|---|
| 5,297,231 A | 3/1994 | Miller | |
| 5,936,424 A | 8/1999 | Young et al. | |
| 5,982,672 A | 11/1999 | Moon et al. | |
| 6,007,228 A * | 12/1999 | Agarwal et al. | ........... 700/94 |
| 6,175,880 B1 | 1/2001 | Hsu et al. | |
| 6,857,039 B1 | 2/2005 | Makino | |
| 6,954,652 B1 | 10/2005 | Sakanashi | |
| 7,376,778 B2 * | 5/2008 | Sinai | ........... 710/312 |
| 7,765,019 B2 * | 7/2010 | Sinai | ........... 700/94 |
| 7,885,422 B2 * | 2/2011 | Sinai | ........... 381/119 |
| 2002/0034168 A1 | 3/2002 | Swartz et al. | |
| 2002/0116427 A1* | 8/2002 | Jiang et al. | ........... 708/313 |
| 2002/0137505 A1* | 9/2002 | Eiche et al. | ........... 455/425 |
| 2002/0168999 A1 | 11/2002 | Lin et al. | |
| 2003/0021429 A1 | 1/2003 | Ratcliff et al. | |

(Continued)

FOREIGN PATENT DOCUMENTS

| CN | 1691760 A | 11/2005 |
|---|---|---|
| DE | 101 38 835 A1 | 2/2003 |

(Continued)

OTHER PUBLICATIONS

"AC'97 Audio + Touchpanel CODEC", Wolfson Microelectronics, Preliminary Technical Data, Dec. 2004, www.wolfsonmicro.com.

(Continued)

*Primary Examiner* — Joseph Saunders, Jr.

(74) *Attorney, Agent, or Firm* — Dickstein Shapiro LLP

(57) ABSTRACT

The present invention provides an audio codec for converting digital audio signals to analogue audio signals, the audio codec comprising: two digital audio bus interfaces for coupling to respective digital audio buses; a digital-only signal path between the two digital audio bus interfaces, such that no analogue processing of the audio signals occurs in the digital-only signal path.

24 Claims, 26 Drawing Sheets

U.S. PATENT DOCUMENTS

| | | |
|---|---|---|
| 2003/0067402 A1 | 4/2003 | Subramoniam et al. |
| 2003/0130016 A1 | 7/2003 | Matsuura et al. |
| 2004/0260983 A1 | 12/2004 | Leung et al. |
| 2005/0064915 A1 | 3/2005 | Lair |
| 2005/0107120 A1 | 5/2005 | Yueh |
| 2005/0159833 A1 | 7/2005 | Giaimo et al. |
| 2006/0041895 A1 | 2/2006 | Berreth |

FOREIGN PATENT DOCUMENTS

| | | |
|---|---|---|
| EP | 0851 423 A1 | 7/1998 |
| EP | 0982 732 A1 | 3/2000 |
| EP | 1443737 A1 | 8/2004 |
| GB | 2308775 A | 7/1997 |
| GB | 2 352 136 A | 1/2001 |
| JP | 57187726 A | 11/1982 |
| JP | 2000/332677 | 1/2003 |
| JP | 200346603 A | 2/2003 |
| JP | 2004254023 A | 9/2004 |
| WO | WO-95/03571 A | 2/1995 |
| WO | WO 99/11048 A1 | 3/1999 |
| WO | WO-0057566 A1 | 9/2000 |
| WO | WO 01/15410 A2 | 3/2001 |
| WO | WO 01/43408 A1 | 6/2001 |
| WO | WO 02/065704 A1 | 8/2002 |
| WO | WO-03/056790 A1 | 7/2003 |
| WO | WO-03/096662 A1 | 11/2003 |
| WO | WO-2004/062156 A2 | 7/2004 |
| WO | WO-2007/024566 A2 | 3/2007 |

OTHER PUBLICATIONS

Intel: "Intel PXA27x Processor Reference Platform", Intel User's Guide, Communication Processor and Audio Concept, Intel, U.S., Sep. 2004.

* cited by examiner

CELLULAR WIRELESS TELEPHONE AND AUDIO CODEC THEREFOR

FIELD OF THE INVENTION

This application is a continuation of Ser. No. 11/318,600 filed Dec. 28, 2005 now U.S. Pat. No. 7,765,019, the entire disclosure of which is hereby incorporated by reference.

The present invention relates to digital apparatus, methods and signalling for enabling communications between a number of inter-connected circuits, and is especially though not exclusively related to digital audio communications in a digital audio convergence device such as a Smartphone.

BACKGROUND OF THE INVENTION

A bus is a shared communications path comprising a number of conductors connected to a number of devices, chips or circuits for example chips on an integrated circuit board. By using a contention protocol, a sub-set of the circuits can use the bus for their own communications purposes for a period of time. A bus therefore reduces the number of conductors needed to provide communications between a number of inter-connected circuits which is highly valued in IC and other small scale technologies, resulting in reduced size and cost. However the need for sharing the bus can preclude certain modes of communication and hence limit the range of possible system functionality.

Audio convergence devices are increasingly popular, and generally allow the execution of different types of audio applications, often simultaneously, on the same device. An example of an audio convergence device is a Smartphone, which provides both telephony-based audio applications such as voice calls and device-centric audio applications such as MP3 music playback. The Smartphone can be thought of as a combination of a mobile or cellular telephone and a PDA or palmtop computer. Other examples of audio convergence devices include laptop computers with telephony capability; or indeed any wireless telephony device for example a mobile phone also having device centric audio applications such as MP3 playback.

The audio processing required of the two types of audio signals is very different, for example with telephony applications such as a duplex phone call, real-time signal processing is required and the application is very sensitive to latency. However the fidelity of the sound or voice audio data is relatively low, typically a single or mono 8 kHz channel. On the other hand, whilst playing back stored music such as MP3 tracks does not require the same level of real-time processing ability, the quality of the audio data is often much higher, for example two or stereo channels of 44.1 or 48 kHz per channel.

These different requirements have been handled by largely separating the two processing chains and utilising separate processors for each task, a specialised (communications) DSP core or chip for the telephony and a general purpose (applications) CPU for the device centric audio applications. Both are complex systems in their own right, and operate with largely different interfaces and protocols, so are designed largely independently, even if integrated on a common substrate. This division of hardware and processing is described in more detail in "Implementing Hi-Fi Cellular Convergence Devices Using Intel Xscale Technology", Scott Paden, Dudy Sinai, WINHEC 2004.

A problem with this approach however is that because of cost, size and power constraints, the two sides (communications and applications) of the device must share the audio transducer resources, for example external speaker and headphones. The above reference considers the Intel PCA chip architecture for mobile devices and analyses the pros and cons of using two codecs, each dedicated to a respective processor (communications processor or applications processor), or a single codec associated with one or other of the processors but controlled by it to provide audio transducer services for both processors. A further option is to use a "dual" codec which provides codec functionality for both processors. An example of a dual audio codec chip or IC is the Wolfson Microelectronics WM9713 Dual Codec (Ac'97 Audio+PCM Voice).

Whether the audio codec requirement is implemented as separate circuits or integrated together, the separate processors need to communicate with each other and with the codec or codecs. However this makes further demands on the shared audio data bus which can further limit system functionality.

SUMMARY OF THE INVENTION

In general terms in one aspect the present invention provides a bus architecture which allows simultaneous communications sessions such as audio data transfers between circuits interconnected by the shared bus. The bus includes a pass device or circuit which in one mode divides the bus into two or more sections such that circuits connected to one of the sections can communicate without interference from circuits connected to the other section: The pass device in another mode allows communication across it such that the bus is effectively not sectioned.

In an embodiment a resistor divides a PCM bus into two sections for some applications, such that a communications processor and an audio codec can communicate on one section whilst simultaneously allowing an applications processor and a wireless codec to communicate on the other section. In another application the resistor allows communication between the communications processor and the wireless codec, "across" the resistor or pass device.

By providing a digital audio bus architecture with unitary and divided or dual modes of operation the embodiment reduces the number of buses required and therefore allows further miniaturisation of an audio convergence device supporting two or more types of audio, for example "lo-fi" telephony voice and hi-fi music.

In one aspect the present invention provides a circuit for processing audio signals and comprising: a bus having two bus sections controllably coupled together by a pass device; a first sub-circuit coupled to a first bus section; a second sub-circuit coupled to a second bus section; and a bridge sub-circuit coupled to both bus sections; the bus being operable in two modes either to allow simultaneous transmissions between the bridge sub-circuit and the first and second sub-circuits using the two bus sections separately, or to allow transmissions between the first and second sub-circuits using the two bus sections together.

This allows simultaneous transmissions of two audio data communications on different bus sections, or a single transmission on both sections. This in turn allows for a greater flexibility and number of audio based applications for audio convergence devices.

In an embodiment, the first sub-circuit comprises a wireless codec for wirelessly communicating the audio data with a wireless peripheral device; the second sub-circuit comprises a communications processor for communicating the audio data with a phone network; and the bridge sub-circuit comprises an audio codec for decoding the audio data and driving an audio transducer, and an applications processor for recording and/or reading the audio data, the audio codec and applications processor coupled together independently of the bus.

This means that the wireless codec and the communications processor can provide a phone call to the user in one mode of operation of the bus; or the phone call can be directed to the audio codec and music provided from the applications processor to the wireless codec in another mode of operation of the bus. In the later mode the bus is effectively split by the pass device, whereas in the former mode the bus is unitary. Various other audio applications enabled by this dual mode capability are described in detail below.

The pass device may be a passive device such as a resistor; which is cheap to implement. Alternatively it may be implemented by an active circuit for example utilising a switchable uni-directional buffer which provides greater isolation between the bus sections in the split mode of operation and may allow for a faster data rate on the bus in the unitary mode.

For the purposes of this specification a wireless codec comprises circuitry for interfacing with an audio data bus and with a local wireless device such as a headset via radio circuits. In other words it converts digital audio signals in one format (e.g. PCM) on the bus into wireless signals in another format (e.g. Bluetooth™ (BT) or other wireless technologies such as Wi-Fi—the suite of IEEE802.11 air interface protocols including a, b, and g or Wi-MAX IEEE802.16). For portable audio devices typically Bluetooth will be used for transmission of audio wireless signals to a wireless headset in order to minimise power consumption, reduce silicon real-estate or size, and reduce cost. Typically this is implemented using a Bluetooth™ chipset. Again suitable Bluetooth (or other wireless) codecs will be known to those skilled in the art, for example Texas Instruments BRF6100, BRF6150 and BRF6300.

A communications processor comprises circuitry for interfacing with the audio bus and with an external communications network such as a mobile phone network and is typically implemented with a digital signal processing (DSP) core to implement functions such as managing a traffic channel and possibly a control channel with an external network and reformatting traffic data between the audio bus data format and that used by the traffic channel to the external network. In the described embodiments, the external network is a wireless cellular network such as a GSM or CDMA based network, however other network types could be used for example those defined by the WiMax IEEE802.16 or Wi-Fi IEEE802.11 protocols; or a cordless phone protocol such as DECT. In some embodiments the communications processor may be implemented as a second wireless codec.

An applications processor is typically a general purpose central processing unit (CPU) configured by software to implement functions such as store/retrieve data from local memory, convert between digital formats and control other circuitry within an audio convergence device, typically including operation of the audio bus(es). In some embodiments the applications processor may include an audio bus interface such as a hardwired PCM or AC'97 interface. Typically the applications processor will be in overall control of the audio device, for example controlling the audio and wireless codecs and the communications processor.

An audio codec (coder-decoder) comprises circuitry for converting digital audio signals to analogue audio signals and vice versa for coupling audio transducers such as speakers and microphones or legacy analog signal sources such as gramophone turntables to digital audio circuitry. In the described embodiments the audio codecs incorporate two or more digital audio bus interfaces such as PCM or AC'97.

Audio codecs in some embodiments also include mixers, volume/gain stages, and audio "effects" such as graphic equalisers or 3-D enhancement. Typically the audio codec is optimised for low-power consumption, and operates off low voltages, e.g. 3.3V or lower.

In an embodiment a sub-circuit coupled to the first bus section and a sub-circuit coupled to the second bus section each have a buffer for coupling to the bus. Each buffer receives an input signal and has driving circuitry arranged to drive the bus to a voltage level dependent on the input signal. Each buffer also receives an independent enable or disable signal which prevents the buffer driving the bus, i.e. it places the buffer into a high-impedance or tri-state mode. This arrangement can be used to avoid contention on the bus when a resistor is used as the pass device.

In another aspect there is provided a digital bus circuit such as a PCM bus and comprising a bus conductor such as a single or duplex data wire(s) having two bus sections. This is suitable for the transfer of audio data between connected devices, but may also be used for other applications requiring a "splitable" bus. Each bus section is connected to a pass circuit such as a resistor or active switchable isolating circuit, and also to two bus interfaces for respective circuits. Examples of the circuits include a communications processor, an applications processor, an audio codec and a wireless codec for use in a digital audio device. At least three of the bus interfaces comprise a tri-state output buffer having a tri-state, not outputting or enabled mode and one or more logic output modes (e.g. 1 and 0). The other interface may be receive-only for example, and so not require an output buffer.

In a unitary bus mode the tri-state output buffers are arranged such that only one of said output buffers is not in a tri-state mode, it being in a high voltage or a low voltage logic output mode or state for example. In other words only one of the output buffers is "transmitting". The high and low logic output voltages may correspond to for example 5V and 0V respectively, or some other uni-polar voltage arrangement, or the low voltage logic mode may correspond to a negative voltage such as −5V for example. In the unitary mode, the pass circuit is arranged to substantially couple said bus sections. In an embodiment this is achieved by switching an active pass circuit to connect the two bus sections together. In another embodiment, this is achieved by setting an appropriate value for a passive component or device such as a resistor or MOS device acting as a resistor. The state of the buffers may be controlled by the applications processor for example, or dedicated bus control logic.

In a dual bus mode the tri-state output buffers are arranged such that only one of the output buffers connected to each bus section is not in a tri-state mode and the pass circuit is arranged to substantially isolate said bus sections. In other words one of the output buffers connected to each bus section is outputting a logic value or voltage which does not interfere with the logic output on the other bus section. The pass device may be controlled or switched so as to isolate the two bus sections, for example by turning off a connecting buffer, or a passive device such as a resistor may be suitably sized in order to achieve the same practical effect.

In an embodiment where the pass circuit comprises a resistive circuit, device or component, the pass device is arranged to have an impedance higher than the output buffer impedances such that when one of said output buffers on one of the bus sections is in a high voltage logic output mode and the another said output buffer on the other bus section is in a low voltage logic output mode, the voltage drop across the pass circuit is more than half the voltage difference between voltages corresponding to the high voltage logic output mode and the low voltage logic output mode of the respective output buffers. In other words, the impedance of the pass device in either mode (for example a passive resistor) can be sized or arranged such that the output impedance of the output buffers is less than 50% of the impedance of the pass circuit. In an embodiment, a more stable or secure example of 2% is used, though various values above and below this could be used, for example 15% or 1%.

The resistive device could simply be a resistor, however other resistive components or circuits could alternatively be used, for example MOS-resistors or their JFET equivalents.

In an embodiment data is encoded or formatted using pulse code modulation (PCM) for communication across the bus sections, however other digital data formats could alternatively be used, for example audio codec '97 (AC97), or formatting for a 2/3/4 wire bus such as Serial Peripheral Interface (SPI) bus, or a Microwire™ (National Semiconductor) bus. The bus may be configured with simplex or duplex data conductors, with or without clock and/or control conductors. Pass circuits may be used to separate clock and/or control bus conductor sections associated with the data bus conductors, or these may be unitary. The bus may be suitable for the transfer of digital audio data, or it may be implemented for the communication of other types of data, control signals or even clock signals. In other words it may be used solely to controllably divide two clock, data or control domains.

In an embodiment, the two bus interfaces coupled to a first of the bus sections are coupled respectively to a communications processor for processing digital voice calls and to an audio codec for processing digital audio signals into analogue audio signals, and one of the bus interfaces coupled to a second of the bus sections is coupled to a wireless codec for wirelessly transmitting and receiving digital audio signals.

The other bus interface coupled to the second bus section may be coupled to an applications processor for processing digital audio signals. The audio codec may be coupled by a separate digital bus circuit to the applications processor for processing digital audio signals. The separate digital bus may use different digital formatting than the main shared digital audio bus, for example AC and PCM respectively. Alternatively, the other bus interface coupled to the second bus section may be coupled to the audio codec; in this case the audio codec having two bus interfaces (e.g. PCM), one interface connected to one bus section and the other interface section connected to the other bus section.

In another aspect there is provided a digital audio bus circuit comprising: a bus conductor having two sections connected to a pass circuit; a first bus section being coupled to a communications processor for processing digital voice calls and to an audio codec for processing digital audio signals to analogue audio signals, and a second bus section being coupled to a wireless codec for wirelessly transmitting and receiving digital audio signals; wherein the digital audio bus is arranged in use to be switchable between a unitary mode in which digital audio signals on one of the bus sections are coupled by the pass circuit onto the other bus section, and a dual mode in which digital audio signals from one of the bus sections are not coupled by the pass circuit onto the other bus section.

Switching between the unitary mode and the dual mode may be achieved with control of the communications processor, the audio codec and the wireless codec, and using a passive device acting as the pass circuit and having an appropriate value in order to isolate the bus sections in one mode and couple them in the other mode. Control of the circuits connected to the bus sections (e.g. communications processor) comprises controlling their connections or interface with the bus sections, for example to transmit or receive or to isolate.

In an alternative arrangement, an active circuit may be used to implement the pass circuit in which case this may be suitably controlled together with the devices or circuits connected to the bus conductors in order to switch between the unitary and dual bus modes. In an embodiment the pass circuit or device is switchable between a high impedance mode and a low impedance mode.

The bus circuit may be simplex, or may comprise a second bus conductor, a second pass circuit and corresponding second couplings to the communications processor, audio codec, and wireless codec and arranged to implement a duplex digital audio bus.

In general terms in another aspect, there is provided an audio codec architecture which is configurable or switchable into a number of functional arrangements in order to provide audio data processing functions. The audio codec comprises one or more digital to analogue converters (DAC) and/or analogue to digital converters (ADC) in order to convert digital audio signals into analogue audio signals and vice versa. The audio codec also comprises two or more digital audio bus interfaces, for example a PCM interface for coupling to the dual mode bus circuit described above and an AC interface for coupling to the applications processor described above. Alternative arrangements can also be employed, for example two PCM interfaces connected to different PCM bus sections. Other interface types and connections are also contemplated. In an embodiment the audio codec also comprises digital and/or analogue adders, multipliers, sample rate and digital format converters, and a switching matrix controllable to couple a number of these circuit elements between the two digital audio bus interfaces.

In one aspect there is provided an audio codec for converting digital audio signals to analogue audio signals, the audio codec comprising two digital audio bus interfaces for coupling to respective digital audio buses and a digital-only signal path between the two digital audio bus interfaces, such that no analogue processing of the audio signals occurs in the digital-only signal path. In its simplest form, where the two digital audio bus interfaces use the same sample rate and digital format, the digital audio data can be simply transferred from one interface to the other. Some simple manipulation and retiming of the signal may be employed for example involving some temporary signal storage such as a FIFO. The digital only signal path may also comprise a digital format conversion function where the two digital audio bus interfaces use different digital formats, for example PCM and AC. This may involve repeating or omitting samples if the input and output data rates are different. Some embodiments may comprise digital signal processing, for example volume control, digital filtering, or mixing of other signals, or sample-rate-conversion, involving digital addition and multiplication of the signals.

An example of functionality of the audio codec achieved by appropriate configuration of the switching matrix includes adding together digital audio signals received from both said digital audio bus interfaces, and transmitting the combined signal from one of said digital audio bus interfaces. This may include scaling one of the received digital audio signals compared with the other received digital audio signals before said addition of the received signals. Sample rate and/or digital format conversion may also be implemented where the digital interfaces are different.

The so configured audio codec may be usefully combined with other circuitry such as the applications processor, communications processor, and wireless codec mentioned above to perform audio processing functions such as combining a received call with background music.

The audio codec may additionally comprise an analogue signal path for processing a received digital audio signal, the analogue signal path comprising one or more signal analogue processing elements such as digital-to-analogue converters, analogue-to-digital converters, adders, and multipliers. The ADC and DAC may have different sample rates in order to implement sample rate conversion of one of the received digital audio signals.

The audio codec may comprise simplex or duplex digital only signal paths, and the internal configuration or connections of the audio codec may be different for the different signal paths. A path with analogue processing may be used to complement the digital only path.

In another aspect there is provided an audio codec for converting digital audio signals to analogue audio signals, the audio codec comprising: two digital audio bus interfaces for coupling to respective digital audio buses; means for adding together digital audio signals received from both said digital audio bus interfaces, and transmitting the combined signal from one of said digital audio buses.

The audio codec may also include digital sample rate conversion (SRC) in one or both input paths. Where both input paths have sample rate conversion, one may be achieved in the analogue domain using suitable DAC and ADC conversions, and the other in the digital domain.

The adding may be implemented digitally or by converting to the analogue domain and using an analogue adder and/or multiplier before converting back to the digital domain.

The audio codec may form part of a larger digital audio device, wherein one of the interfaces is coupled to a communications processor for processing a voice call and the other interface is coupled to an applications processor for processing digital audio signals.

In an embodiment, an AC digital audio interface is used to couple to another circuit such as an applications processor, and this is configured with three or more audio channels. These channels can be mapped to two or more other digital audio interfaces, for example simply to route digital audio signals to different circuits coupled to the audio codec, or additionally with audio signal processing performed by the codec. More generally the audio codec could be used to couple together circuits having incompatible digital audio interfaces, for example an applications processor with an AC only interface being coupled to a PCM digital audio bus.

Where the audio codec comprises two PCM digital audio interfaces, the second such interface may simply comprise a single data pin, the other control and clock pins being shared with the first PCM interface. This arrangement can be used to couple both sections of the above mentioned dual mode PCM bus architecture.

These audio codec arrangements may be advantageously combined with the digital bus and audio device arrangements outlined above, however these audio codecs can be implemented independently of these bus and audio device arrangements. For example the audio codec may be used with a bus without a pass circuit or otherwise "split-able" digital audio bus.

In general terms in another aspect the present invention provides methods of operating a digital audio device such as a smart phone or communications enabled PDA in order to perform a number of audio processing functions. These methods may be implemented using the digital bus, audio device and/or audio codec arrangements outlined above, or they may be implemented using a different audio device and/or bus and/or audio codec arrangement.

In one aspect there is provided a method of operating a digital audio device, the method comprising: receiving a voice call such as a GSM connection; receiving another digital audio signal such as an MP3 playback and which is not a voice call; mixing the two received signals; and simultaneously transmitting the mixed signal wirelessly to another device, for example using a Bluetooth (BT) connection.

The feature of receiving another digital audio signal which is not a voice call can include receiving this from an internal digital audio device component such as its local memory, and is not necessarily restricted to receiving the signal from an external source; although this may have occurred at an earlier time for example downloading an MP3 track from the Internet via the communications processor onto the local memory.

In an embodiment this is implemented using the dual bus mode to receive voice call signals over one bus section and transmit the mixed signal to a wireless codec over the other bus section. However other methods of implementing this functionality could alternatively be used, for example using two separate audio buses, or a (normally) control bus such as a UART. In an embodiment the mixing is implemented in an audio codec such as one of the audio codecs outlined above, but this could alternatively be carried out in an applications processor for example.

In an embodiment the voice call is processed by a communications processor on or coupled to the device, and the other digital audio signal is a hi-fi signal from an applications processor. However other received signals could be used, for example a signal received from a wireless codec. The sample rates and/or digital formats of the two received digital audio signals can be different.

In an embodiment, the method further comprises wirelessly receiving another signal such as the other half of a duplex voice call and transmitting this, for example over a GSM connection.

In another aspect there is provided a method of operating a digital audio device, the method comprising: receiving a wireless digital audio signal from another device, storing said signal; simultaneously transmitting a second wireless digital audio signal to the other device; and simultaneously transmitting a third digital audio signal in response to receiving a voice call.

In an embodiment, this is implemented using a wireless codec to receive and transmit the wireless signals, and an applications processor to transmit the third signal, the second signal being transmitted from the applications processor to the wireless codec. In an embodiment, the second digital signal can be routed from the applications processor directly to a digital audio bus as outlined above, or via an audio codec onto the digital audio bus as also outlined above. Alternatively, different audio bus and/or audio codec architectures could be used.

In an embodiment, the first wireless digital audio signal is a digital dictation signal, the second digital audio signal is a hi-fi music signal, and the third digital signal is a predetermined outgoing message.

In another aspect there is provided a method of operating a digital audio device, the method comprising: receiving a wireless digital audio signal from another device, storing said signal; simultaneously transmitting a second wireless digital audio signal to the other device; simultaneously receiving a third digital audio signal associated with a voice call, storing said signal.

In an embodiment, this is implemented using a wireless codec to receive and transmit the wireless signals, and an applications processor to receive the third signal, the second signal being transmitted from the applications processor to the wireless codec. In an embodiment, the second digital signal can be routed from the applications processor directly to a digital audio bus as outlined above, or via an audio codec onto the digital audio bus as also outlined above. Alternatively, different audio bus and/or audio codec architectures could be used.

In an embodiment the first wireless digital audio signal is a digital dictation signal, the second digital audio signal is a hi-fi music signal, and the third digital signal is an incoming voice call message. The method may further comprise simultaneously mixing the received third digital audio signal with the second digital signal and transmitting the mixed signal wirelessly to the other device.

In another aspect there is provided a method of operating a digital audio device, the method comprising: communicating a duplex voice call with another device and simultaneously wirelessly communicating said duplex voice call with a second other device; simultaneously and independently recording each half of said duplex voice call.

In an embodiment the outgoing and incoming audio signals are recorded separately by an applications processor into local memory. The signals are received by an audio codec on a PCM interface and transferred to the applications processor over an AC interface using two AC channels.

In an embodiment, this is implemented using a wireless codec to receive and transmit the wireless signals, and an applications processor to receive and forward for storing the two halves of the duplex call. In an embodiment, these digital signals can be routed from a digital audio bus as outlined above directly to the applications processor, or via an audio codec from the digital audio bus as also outlined above. Alternatively, different audio bus and/or audio codec architectures could be used.

In another aspect there is provided a method of operating a digital audio device, the method comprising: communicating a duplex voice call with another device and simultaneously wirelessly communicating said duplex voice call with a second other device; simultaneously mixing each half of the duplex voice call and storing the mixed signal, and independently processing the received wireless voice call. In an embodiment the independent processing is monitoring the voice call for voice activated commands.

In an embodiment, this is implemented using a wireless codec to receive and transmit the wireless signals, and an applications processor to receive and independently processes the received wireless call, and to forward for storing the two halves of the duplex call, including in an embodiment mixing the two halves of the duplex call before storage. In an embodiment, these digital signals can be routed from an digital audio bus as outlined above directly to the applications processor, or via an audio codec from the digital audio bus as also outlined above. Alternatively, different audio bus and/or audio codec architectures could be used.

In an embodiment the signals are received by an audio codec on a PCM interface and transferred to the applications processor over an AC interface using two AC channels.

These digital audio device operations or applications may be advantageously combined with the digital bus and/or the audio codec arrangements outlined above, however this is not necessary. For example recording a voice call between the communications processor at the applications processor does not require a split or dual mode bus. Similarly some or all of the audio digital processing such as mixing two signals or converting between different sample rates and/or digital formats may be carried in the applications processor rather than the audio codec for example.

There are also provided devices and software or computer programs corresponding to the above outlined methods. There are also provided methods and software or computer programs corresponding to the above outlined devices or circuitry.

BRIEF DESCRIPTION OF THE DRAWINGS

Embodiments will now be described with respect to the following drawings, by way of example only and without intending to be limiting, in which.

DETAILED DESCRIPTION

Figure 1:
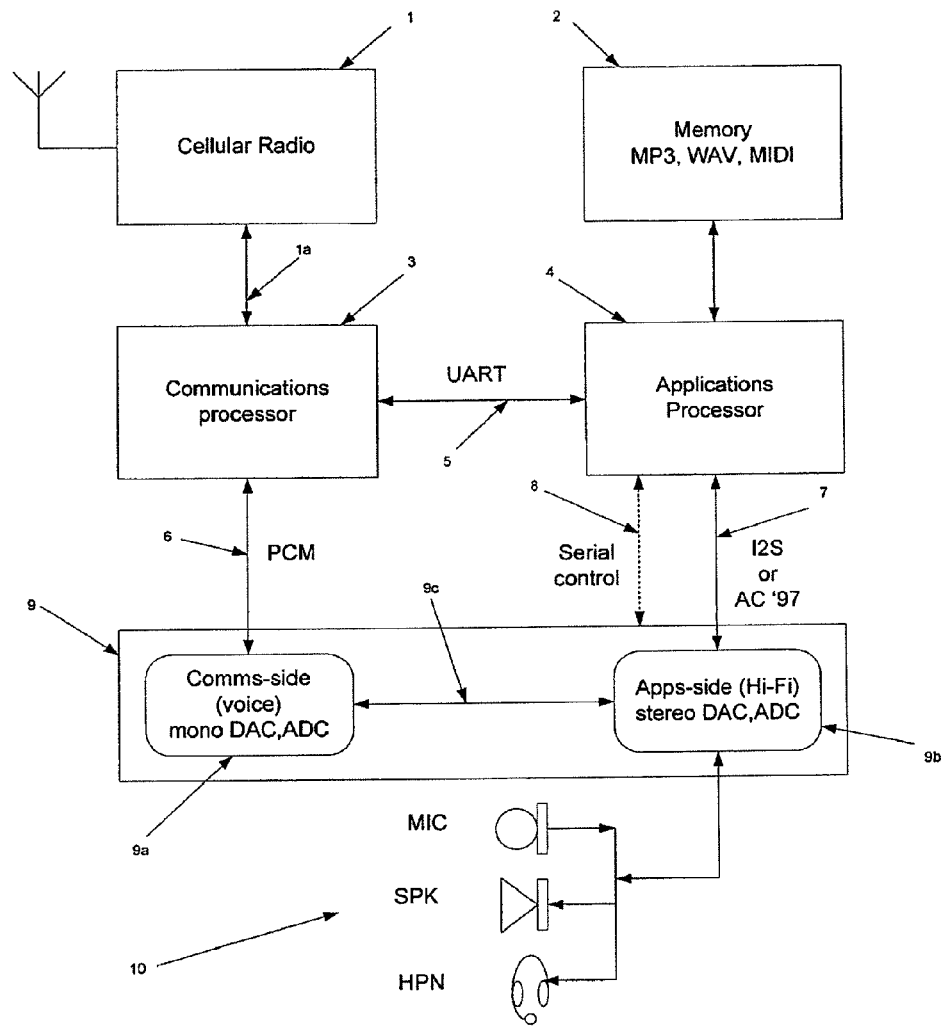
FIG. 1 shows a known Smartphone audio bus architecture.

Referring to FIG. 1, the audio based architecture of an audio convergence device such as a Smartphone is shown and comprises a cellular radio 1 such as a GSM transceiver; a memory 2 for storing audio files such as MP3, MIDI, and WAV (or any program code used to run the platform); a communications processor 3 such as a specialised DSP; an applications processor 4 such as a general purpose CPU; a dual audio codec 9; various audio transducers shown generally as 10 and including a microphone, a speaker, and headphones; buses 5, 6, 7, and 8 between the communications and applications processors 3 and 4 and the codec 9.

The type or format of the buses (5, 6, 7, 8) or connections between the circuits will depend on their function and the types of data to be transferred as known, and will typically include: a serial connection 5 such as a UART bus between the communications and applications processors 3 and 4; a PCM or pulse coded modulation bus 6 between the communications processor 3 and audio codec 9; an I2S or AC data link 7 between the applications processor 4 and the codec 9; and if not using an AC data link (7) to pass control information, a serial control link 8 can be used between the applications processor and the codec 9. The PCM bus 6 provides a low latency signal path between the communications processor 3 and the codec 9, which is suitable for real-time voice calls. The AC data link 7 provides a wide bandwidth suitable for high quality digital audio signals such as hi-fi music transferred from the applications processor 4 to the audio codec 9.

Figure 2A:
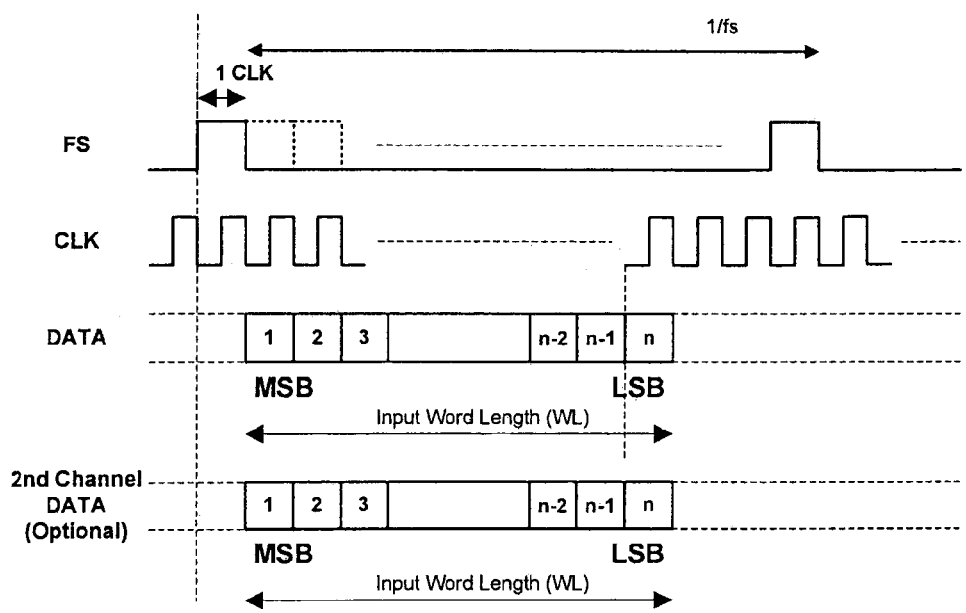
FIG. 2a shows waveforms on a typical PCM bus.

The PCM bus 6 can be a 3- or 4-wire bus, with a bit-rate clock line CLK, a frame-rate or frame-sync clock line FS, and one or two data lines DATA carrying serial digital data in say 8- or 16-bit words, synchronised to the bit and frame clocks, as shown in FIG. 2a. The clocks are generated by a chosen one of the chips connected to the bus. PCM1900 is an example of an existing standard for such buses. In principle, a different clocking or bus-width might be employed, even a 8- or 16-bit parallel bus for example, though usually this would be more expensive in terms of wires and connectors, and unnecessary for the relatively slow data rates involved (typically 16 bits×8 ks/s=128 ks/s)

Other types of audio buses that might be employed include 2/3/4 wire SPI or Microwire™ buses.

Figure 2B:
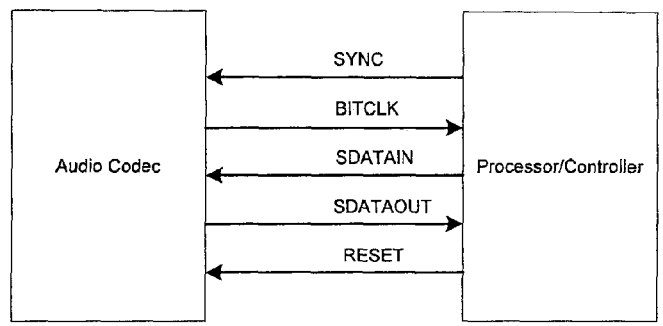
FIG. 2b shows the physical structure of an AC-link and FIG. 2c shows data structure and timing of the AC-link.
Figure 2C:
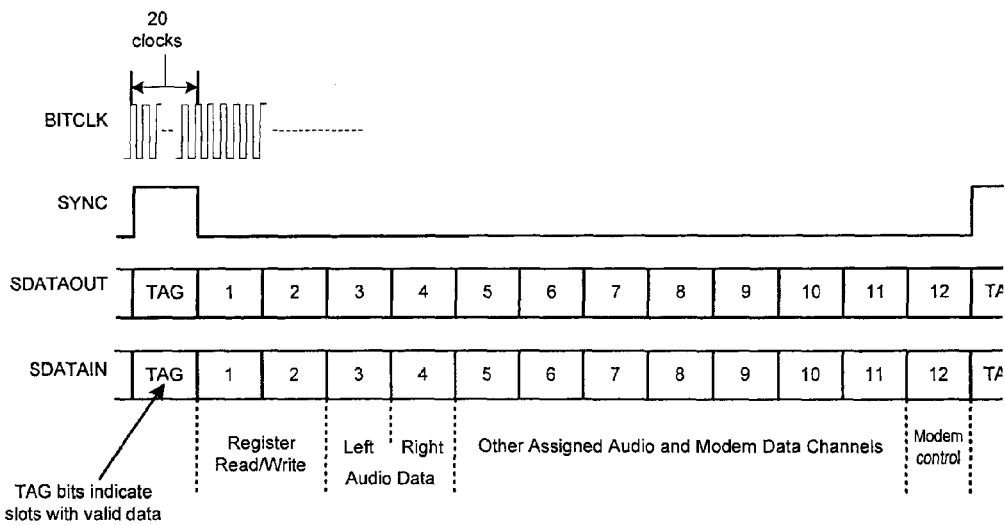

The main data link between the audio codec 9 and the applications processor 4 could be any data link, for example an I2S link, or other known 3- or 4-wire serial or even parallel interfaces. However it will typically be an AC '97 standard compliant "AC-link". This standard 5-wire bidirectional fixed clock-rate serial digital interface comprises four clock and data lines and a codec reset line as shown in FIG. 2b. It handles multiple input and output PCM audio streams, as well as control register accesses, employing a time division multiplexed (TDM) scheme that divides each audio frame into 12 outgoing and 12 incoming data streams, each with 20-bit sample resolution, together with a TAG time slot, as shown in FIG. 2c. The MSBs of the TAG slot indicate which following time slots contain valid data. According to the AC '97 standard, the first two time slots are concerned with reading or writing registers on the codec, the next two are for left-channel and right-channel audio data, and the other timeslots are also assigned various uses for other audio and modem channels or modem control, including the possibility of increasing the effective audio sample rate by using other slots for additional samples of the left and right audio signals.

As well as being able to carry multiple channels of audio, the AC-link can also make use of the TAG function to carry "Variable-Rate Audio" VRA, which means different sample rate of playback and recorded audio streams can be simultaneously carried over the link. As an example a stereo 44.1 ksps can be played back while a mono 8ksps can be recorded. This in practice makes the AC-link a lower pin count compared with an I²S which requires as a minimum another clock (and another frame sync for the different sample rate). AC'97 can also carry control data, which can avoid the need for separate control bus pins and wires.

For simplicity in explanation, the following description will refer to the link between the audio codec and the applications processor as an AC-link, but it is to be understood that an alternative link may be used. This includes the emerging Mobile Industry Processor Interface (MIPI) Low-Speed Multilink (LML) standard. If an AC-link is not used, the additional control link 8 may be necessary, as many other links will generally only carry data not control information.

Also for clarity in the explanation of the architectures and signal flows, the clock lines associated with the various audio data links are omitted from the system diagrams below, as are most of the control links 5 and 50 and 8.

Figure 3A:
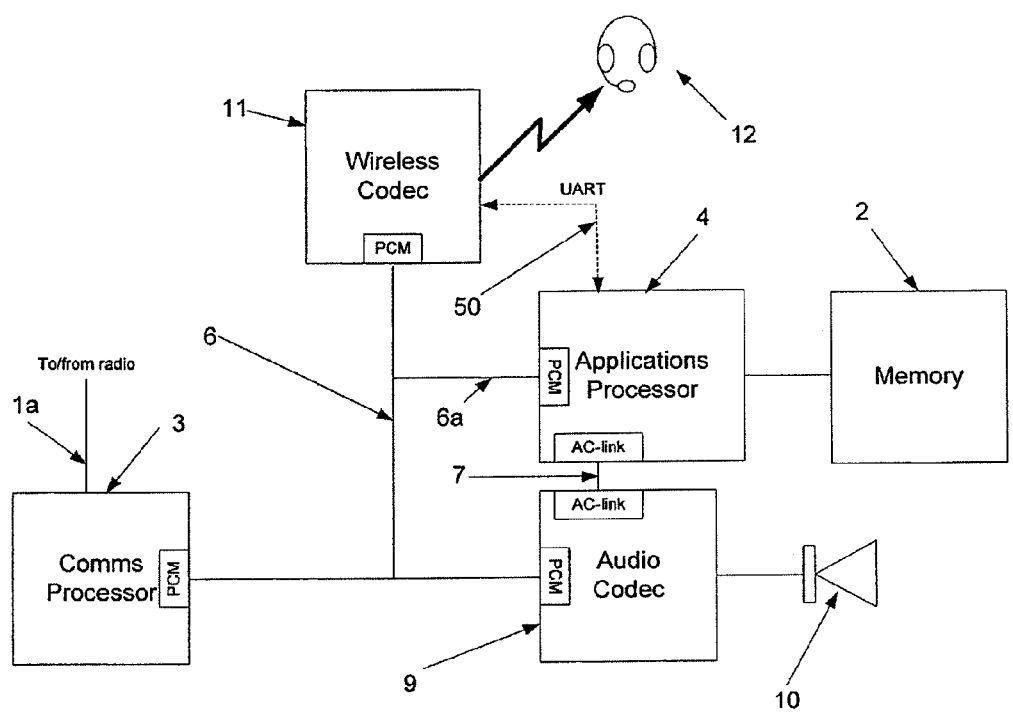
FIG. 3a is another bus architecture.

Referring again to FIG. 1, the audio codec 9 is suitable for processing both the real-time low bandwidth audio or voice calls and the latency tolerant but high bandwidth high quality or sample rate audio from applications such as stereo MP3 music playback. This "dual functionality" codec 9 comprises: voice optimised circuitry 9a for processing voice audio data to/from the communications processor 3, including a mono DAC and ADC; Hi-Fi or music optimised circuitry 9b for processing the higher sampling rate high resolution audio data to/from the applications processor 4, including stereo DACs and ADCs, analogue mixing and amplifier circuits; and a (analogue) link 9c between the two codec circuits 9a and 9b, typically in the analogue do main. The codec 9 may or may not be integrated as a single circuit, rather than two separate circuits FIG. 3a shows a modified system architecture including wireless headphone or headset capability which is an increasingly popular requirement. Typically this is implemented using a Bluetooth™ chipset, but is termed here more generally as a wireless codec 11. Other wireless technologies could alternatively be used such as Wi-Fi (the suite of IEEE802.11 air interface protocols including a, b, and g). The wireless codec 11 is advantageously coupled to the PCM bus 6 between the communications processor 3 and the audio or local codec 9. This provides a low latency path for voice calls from the communications processor 3 to the wireless codec 11. In addition wireless codecs such as Bluetooth codecs typically already include a PCM interface so that legacy equipment or circuits can be employed. This allows sharing the same interface while avoiding extra pins and/or dedicated interfaces, which requires extra software additions and/or changes, and thus reduces design costs and time to market.

The applications processor 4 may transfer audio data to the wireless codec via a serial bus 50 such as an internal system UART or USB link if this is available, however typically this audio data is transferred over the PCM bus 6 via segment 6a. This may be achieved as shown in FIG. 3a where the applications processor 4 incorporates a PCM interface.

This type of audio architecture can be provided for an audio convergence device such as a Smartphone. As noted above a Smartphone typically provides both cellular wireless communications or phone functionality and PDA type functionality including playing audio (e.g. Hi-Fi music) files, dictating notes, voice commands and other audio based applications. Such devices are increasingly converged in the sense that on-board devices are shared, such as memory which stores for example both MP3 files for playback through a music player application as well as an outgoing message (OGM) for playback to a caller interfacing with the device's phone functions. Similarly the audio transducers are shared in order to reduce weight, cost and size.

Referring to FIG. 3a in more detail, the audio system architecture includes the audio (PCM) bus 6 which interconnects a number of circuits including the communications processor 3 which handles the Smartphone's cellular wireless functionality, the wireless codec 11 which handles the Smartphone's local wireless networking functionality (e.g. Bluetooth), the applications processor 4 which handles the Smartphone's PDA functionality such as playing audio files from memory 2 and providing diary and contacts functions, and the audio codec 9 which handles the provision of analogue audio signals to the Smartphone's sound transducers (e.g. speaker and/or headphones 10). The wireless codec 11 interfaces wirelessly with a wireless headset 12 which may include earphone speakers and/or a voice microphone.

Figure 3B:
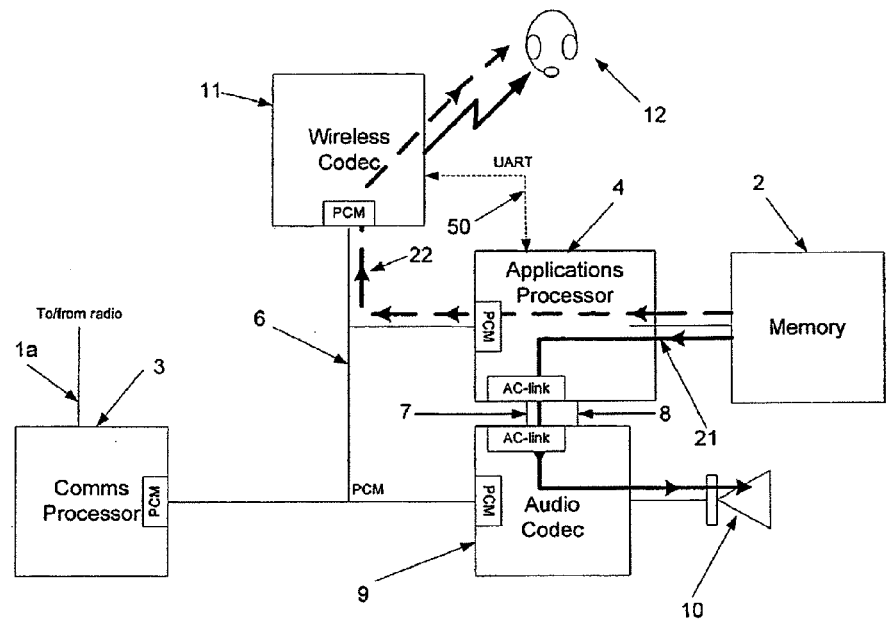
FIGS. 3b and 3c illustrates audio applications using this architecture.

In the mode of operation or "application" of listening to music stored in memory (possibly placed there from a disc drive), Hi-fi music signals are typically transferred directly from the applications processor 4 (having retrieved them from memory 2) to the audio codec 9 via the data link 7 (e.g. I2S or AC97 AC-link), for playback over the device's speaker 10 or headphones—this is indicated by audio signal path 21 in FIG. 3b. In Smartphones so equipped, this music may also be played back over wireless (e.g. Bluetooth) headsets 12. This requires the applications processor 4 to transfer the music signals to the wireless codec 11, and this can be done by utilising the shared PCM bus 6, as illustrated by dashed line 22 in FIG. 3b. Using the PCM bus 6 as opposed to a UART bus 50 (where this latter option is supported by both the wireless codec 11 and applications processor 4) avoids the need for special profiles in both Applications processor 4 as well as the wireless codec (e.g. BT chipset) 11, which add substantially to the design effort, cost, and time taken to integrate the system.

Figure 3C:
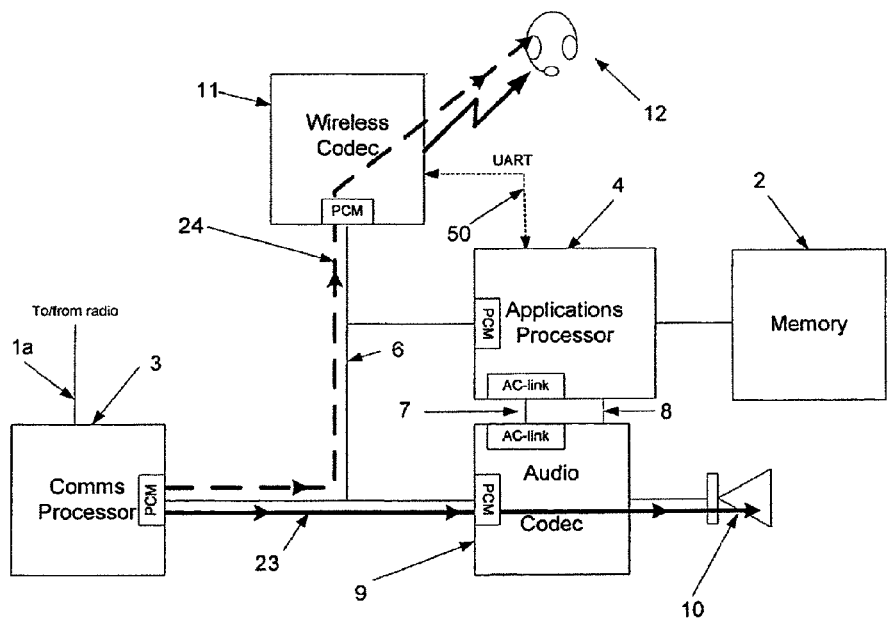

In another application (see FIG. 3c), for listening to an incoming voice call, audio signals from the communications processor 3 (e.g. the caller's voice) are transferred using the PCM bus 6 to the audio codec 9 for playing over the speaker 10 or headphones, as illustrated by signal flow line 23. These audio signals may also be played over the Bluetooth headsets 12 by transferring the signals to the wireless codec 11 using the PCM or shared audio bus 6, as illustrated by dashed line 24 in FIG. 3c.

Increasingly users of Smartphone devices wish to make use of multiple applications or tasks simultaneously. It will be seen however that both of the wireless headset applications described above cannot be performed simultaneously, as the communications processor and the applications processor can not both use the shared bus 6 at the same time. Thus whilst the user may wish to listen to an incoming voice call and at the same time have the music still playing in the background, this is not possible with the described bus architecture when utilising wireless headsets. Indeed even using the device's speaker/headphones 10 for the voice call and the wireless headset for the audio playback is not possible as this would still require both applications (line 23 and line 22) to use the bus 6 at the same time. A possible solution to this problem, and more generally the problem of utilising multiple applications simultaneously, is to incorporate additional buses into the Smartphone or similar device, however this is both expensive, and runs counter to the general aim of miniaturising the components of such devices.

Figure 4A:
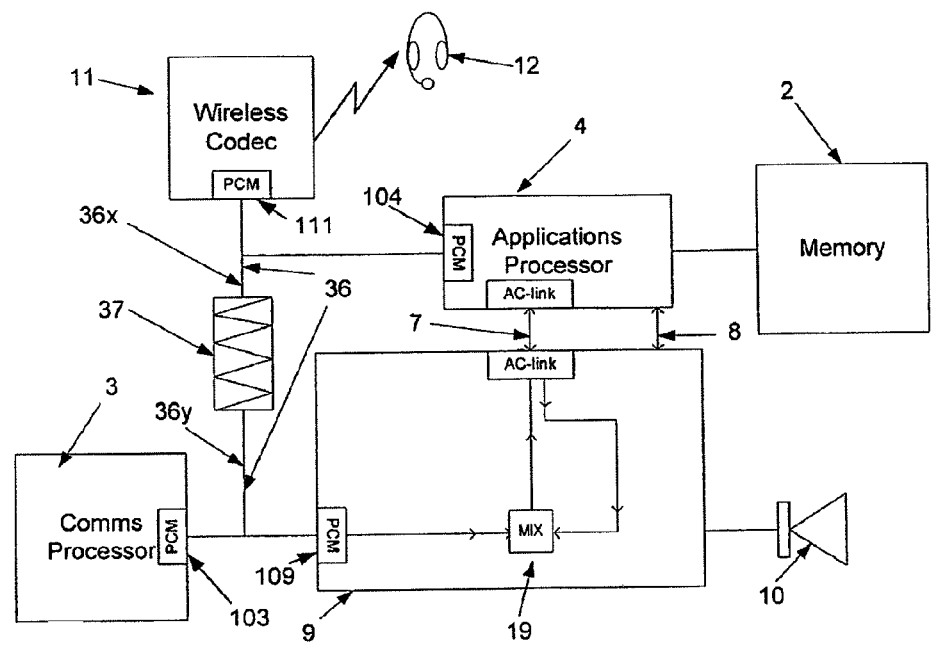
FIG. 4a shows another bus architecture and FIG. 4b illustrate simultaneous audio file playback and call receiving applications using this bus architecture.

FIG. 4a illustrates an audio bus architecture having a further modified arrangement according to an embodiment and which allows simultaneous use of the audio bus by two different applications. The communications processor, wireless codec, applications processor, memory and voice codec circuits described above are the same or similar, and are here referenced the same as in the previous figures. This provides the same 'User Experience' of the local or audio codec 9 with the wireless codec 11, all whilst minimising design effort (integration) and cost (including time-to-market).

The audio (PCM) bus 36 however includes a pass device or circuit 37 which in one mode of operation of the bus divides the bus into two sections 36x and 36y as shown. In another mode, the pass device 37 is transparent to signals on the bus 36 comprising 36x and 36y such that the bus is effectively unitary. The pass circuit 37 is located between the applications processor 4 and audio codec 9 connections to the bus 36, such that a first section of the bus 36x includes connections to the wireless codec 11 and the applications processor 4, and the other section 36y includes connections to the communications processor 3 and the audio codec 9.

The pass device 37 is preferably a passive device such as a resistor. This eases implementation and cost. However active circuits or devices such as transistor switches may alternatively be used in order to switch between the two modes of bus operation as described in more detail below. Such switches may be controlled by the applications processor 4, and provide greater isolation between PCM signals on the two sections 36x and 36y of the PCM bus.

Figure 5A:
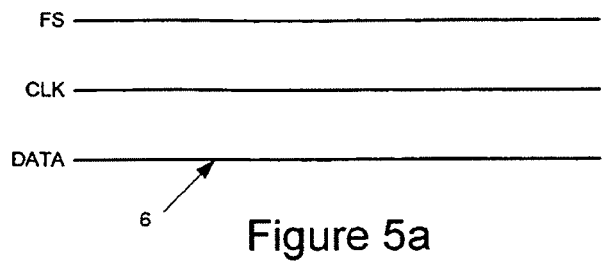
FIG. 5a shows a known 3-wire bus.
Figure 5B:
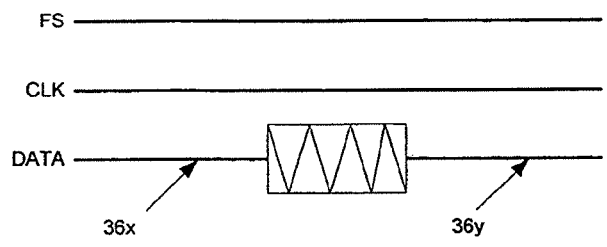
FIG. 5b shows a dual-mode bus.
Figure 5C:
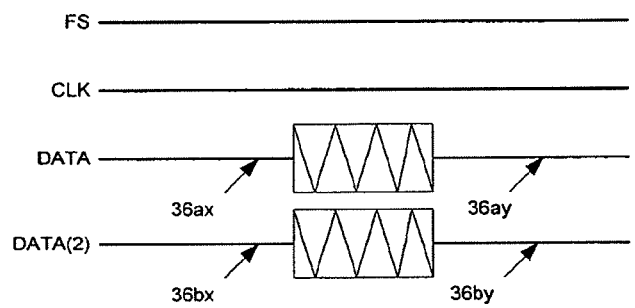
FIG. 5c shows a duplex dual-mode bus.
Figure 5D:
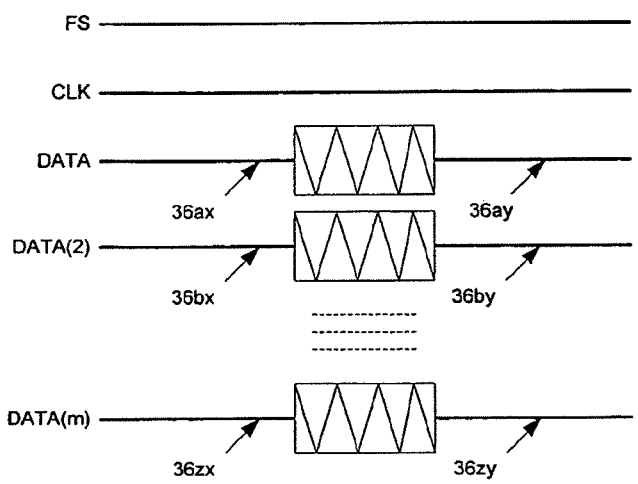
FIG. 5d shows a multi-bit dual-mode bus.
Figure 5E:
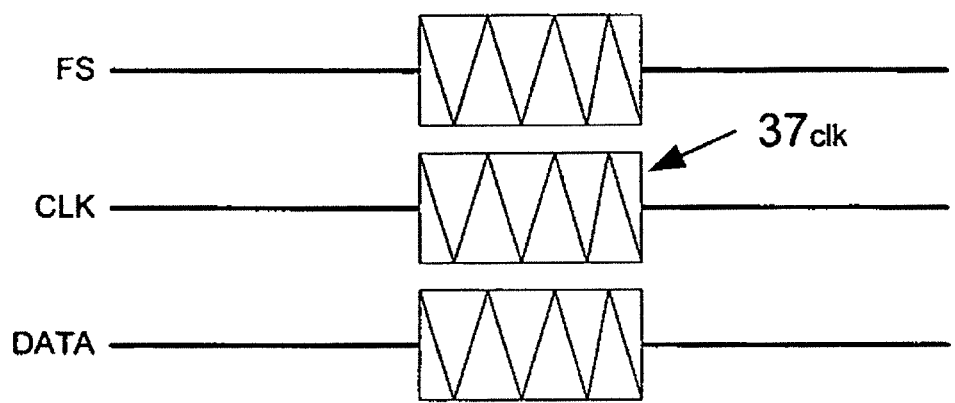
FIG. 5e shows a dual-mode bus with pass devices in clock lines.

The PCM bus will generally also comprise clock lines, for bit clock CLK and frame clock FS for example as shown in FIG. 2a and FIG. 5a. These could also include pass devices as shown in FIG. 5e, to allow separate clock domains on either side of the pass device $37_{clk}$, however for the embodiment this is not necessary. The simple dual-mode PCM bus may thus comprise three wires as shown in FIG. 5b. The data wire includes a pass device 37; however the two clock wires do not in this embodiment. Duplex or parallel dual-mode buses may comprise more data wires and pass devices, as shown in FIGS. 5c and 5d. For simplicity, only the data wires will be shown in most diagrams below, and a serial rather than parallel data bus is described for simplicity; however the skilled person will appreciate that various modifications could be made including using a parallel data bus and various configurations of clock and/or control buses.

Operation of the architecture with a simple resistor as the pass circuit 37 is described with respect to FIGS. 4, 6, and 7.

Figure 6A:
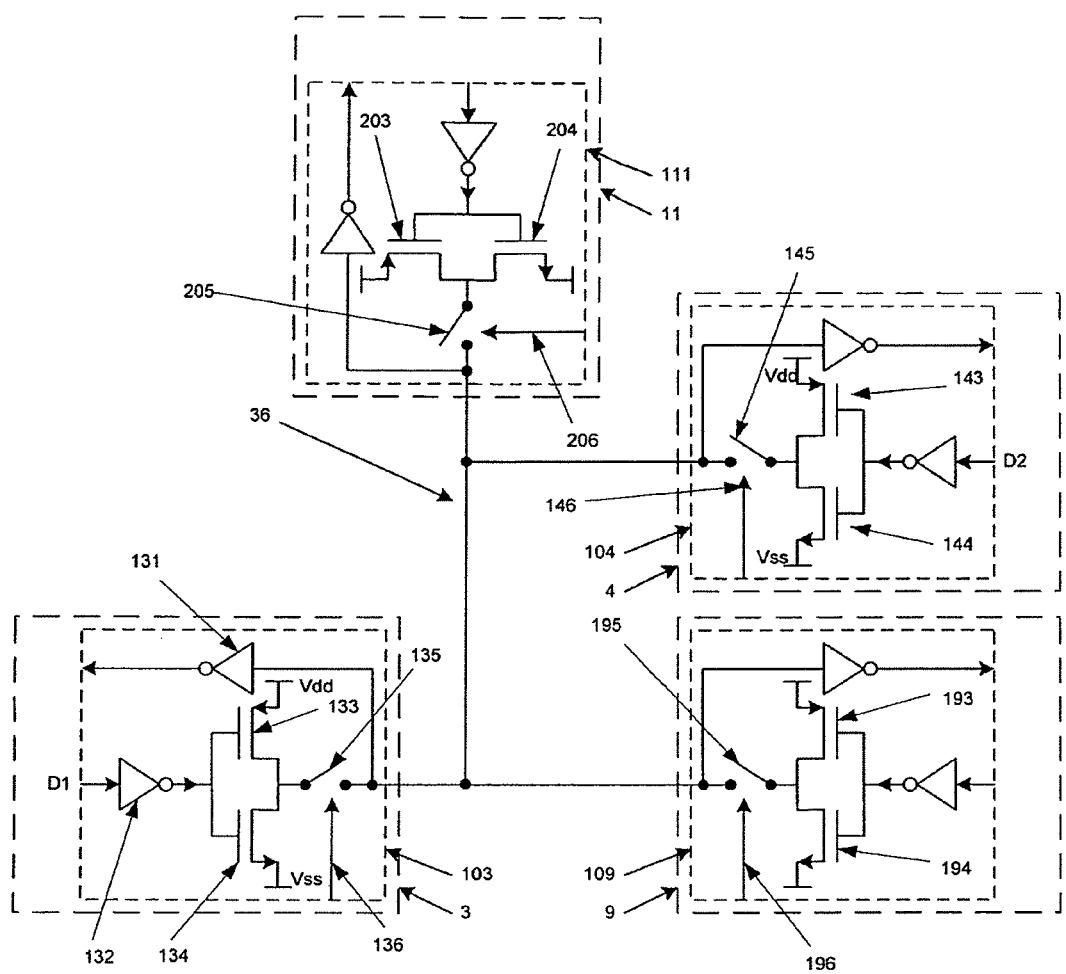
FIGS. 6a and 6b illustrate operation of the bus of FIG. 3a in more detail.

Operation of the bus in split bus mode can be explained by first considering operation without the resistor of the bus 36, and considering the bus interfaces 103, 104, 109, 111 on the attached or respective circuits 3, 4, 9, 11 respectively in more detail. FIG. 6a illustrates a system similar to FIG. 3a with no pass device 37, but comprising a wireless codec 11 an applications processor 4, a communications processor 3 and an audio codec 9. These are connected by a single wire bus 36 as shown in FIG. 6a.

Figure 6B:
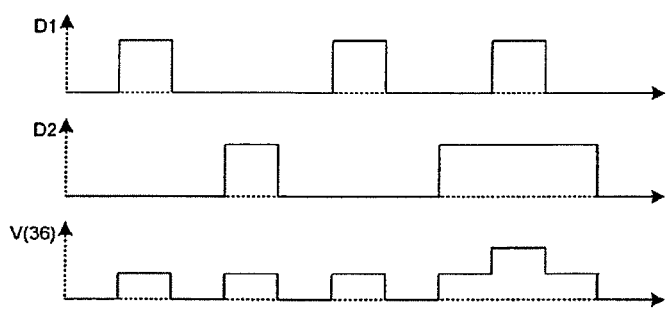

Communications processor 3 comprises a bidirectional, tri-state buffer or bus interface 103 driving the wire 36. The illustrative implementation shown of bidirectional tri-state buffer 103 comprises inverter 131 which couples the logic signal on the wire 36 to the circuitry in the main body of processor 3, to provide an input buffer having a high input impedance. The corresponding output buffer comprises an inverter 132, a further inverter comprising devices PMOS 133 and NMOS 134, and a series switch 135 connected to wire 36. The sources of PMOS 133 and NMOS 134 are connected to a positive logic supply Vdd and a negative logic supply Vss (commonly ground) respectively. When switch 135 is closed, under the control of enable signal 136, a signal D1 from the main body of the processor 3 is buffered by inverters 132 and 133/134 and driven through closed switch 135 to produce a corresponding signal on wire 36, at a voltage equal to Vdd or Vss for D1 high or low respectively. This is illustrated in FIG. 6b. Switch 135 will usually be implemented as a CMOS transmission gate. The output impedance of the output buffer (135 and 133/134) is low, typically of the order of 100 ohms when the switch 135 is closed and the output buffer is in a high voltage (Vdd) logic mode (e.g. D1=1) or a low voltage (Vss) logic output mode (e.g. D1=0). In a tri-state mode when the switch 135 is open, the bi-directional buffer presents a high impedance to the bus line 36.

The illustrative implementation shown of buffer 103 is not meant to be restrictive. Many other implementations of bidirectional tri-state buffer 103 are well known. For example the function of switch 135 may be implemented by pass transistors coupled between the supply and common drain node of 133, 134, or by suitable logic switching the gates of 133, 134.

Wireless codec 11, applications processor 4, and audio codec 9 comprise similar respective buffers 111, 104, 109, connected to bus 36. Similarly these comprise respective series switches 205, 145 and 195; respective enable signal controls 206, 146, and 196; and respective PMOS and NMOS inverter devices 203/204, 143/144, and 193/194. In some cases, some of these buffers may comprise only the input or output functionality of the buffer, i.e. be input or output buffers rather than bidirectional. The logic supplies Vdd and Vss are assumed to be the same or equal for all these buffers.

Generally the buffers will be driven by suitable enable signals so that only one switch e.g. 135 is closed at any one time, so that only the one corresponding interface or buffer e.g. 103 is driving wire 36 at any one time. Configuration of the bus, involving the setting of the I/O modes of the various codecs' and processors' buffers' interfaces to the bus would normally be programmed by the applications processor, along with the other "control" necessary to tell the other processors (and their buffers) what is expected from them. This can be implemented by direct connections from the applications processor to the various bus interfaces, but would more typically be implemented by sending control words to registers in the processors, which would in turn control the enable logic lines to the individual buffers. For example this control communication can be provided over UART bus 5 of FIG. 1 to the communications processor and UART 50 of FIG. 3a to the Wireless CODEC. Most of the time the buffers are enabled only when used, so no special communication is required, i.e. this enabling will happen automatically during the set-up of the data signal paths according to the selected mode or application. This control including the I/O modes required for split mode operations of the bus would be implemented in routine system-level programming.

Normally the bus interfaces would be controlled so that only one of them was driving the bus at once, i.e. all but one would be in high-impedance, tri-state mode. But consider the case when two switches are closed at the same time, say 135 in 103 and 145 in 104, so two buffers are trying to drive opposite polarity signals onto 36.

This is illustrated by the waveforms in FIG. 6b. When both D1 and D2 are low, both 103 and 104 will be trying to pull 36 low, i.e. NMOS 134 and 144 will both be on, so 36 will go low, to the common negative supply rail Vss connected to these NMOS. When both D1 and D2 are high, both 103 and 104 will be trying to pull 36 high i.e. PMOS 133 and 143 will both be on, so 36 will go high, to the common positive supply rail Vdd connected to these PMOS. However if D1 is high and D2 low, NMOS 134 will try to pull 36 down to Vss and PMOS 143 will try to pull 36 high to Vdd. This has two effects. First, the voltage on 36 will end up at some voltage between Vdd and Vss. If the NMOS and PMOS have equal drive strength, this voltage will be halfway between Vdd and Vss, but in practice the drive strengths will be different, so one will dominate. However because of the finite output impedance of the PMOS and NMOS, the voltage may well end up at say one-quarter of the way up from Vss to Vdd, giving an uncertain logic level depending on the input logic thresholds of any logic inputs connected to 36. Second, the PMOS and NMOS of typical processors will typically be able to output tens of milliamps, in order to drive the capacitance of a bus with fast edges. This current will pass from Vdd through the PMOS, wire 36, and the NMOS back to Vss, giving a supply current of tens of milliamps whenever these devices are fighting each other. This is undesirable from a system power dissipation perspective, especially if there are several parallel wires on the bus, and indeed continued operation in this abnormal mode may degrade the reliability of the system.

Figure 7A:
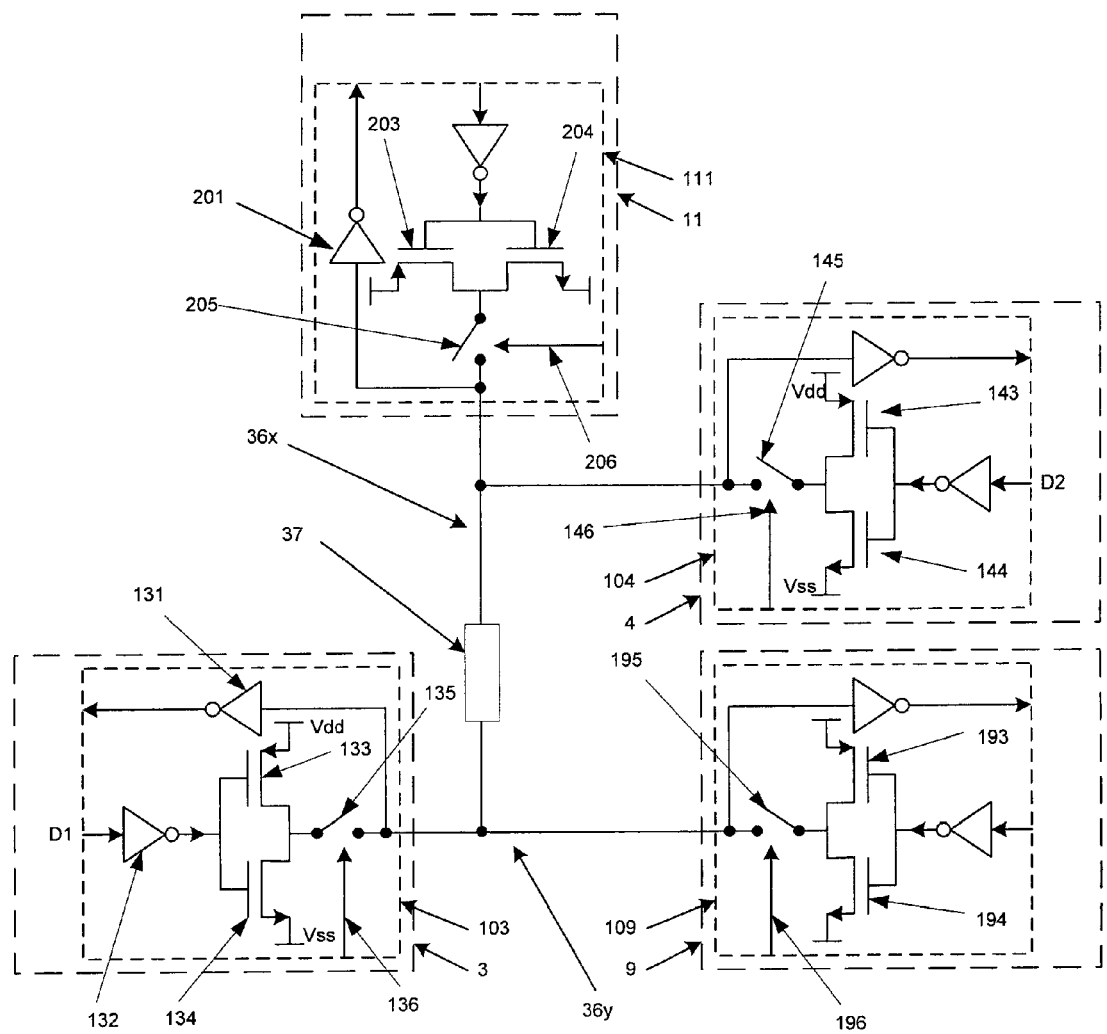
FIGS. 7a, 7b, 7c and 7d illustrate operation of the bus of FIG. 4a in a second (split) mode of operation.
Figure 7B:
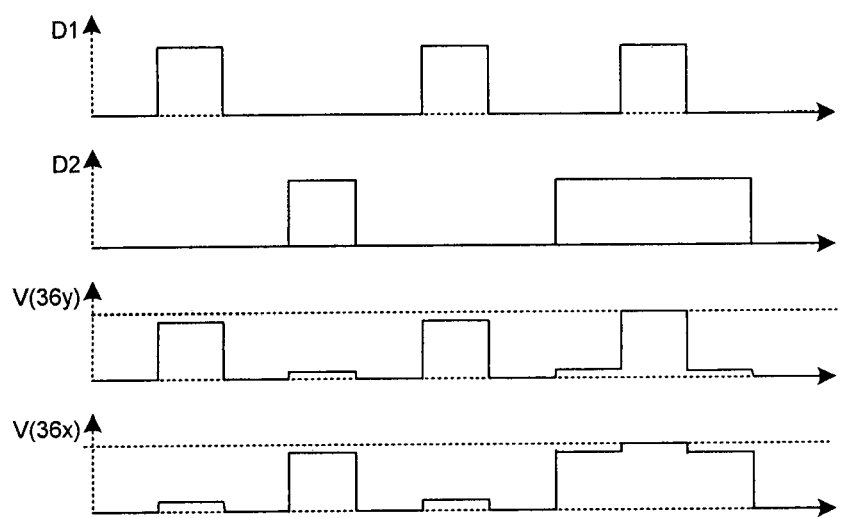
Figure 7C:
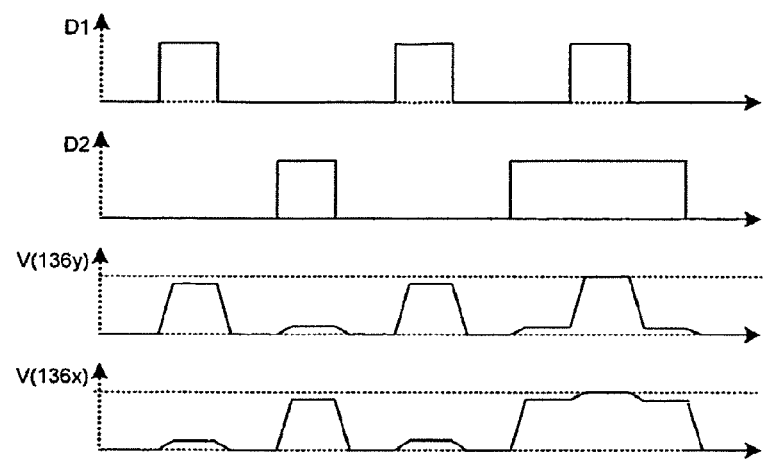
Figure 7D:
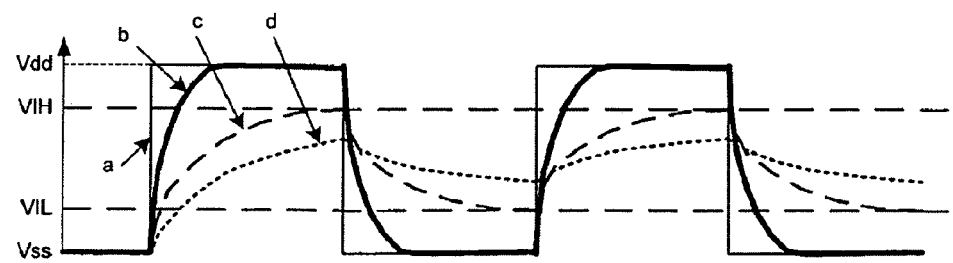

In order to allow simultaneous transmission of data from say communications processor 3 to audio codec 9 and from applications processor 4 to wireless codec 11, pass device 37 is connected in the section of wire 36 from communications processor 4 to wireless codec 11 between the connections to audio codec 9 and applications processor 4, thus breaking 36 into two segments 36y and 36x as shown in FIG. 7a. When both D1 and D2 are low, 103 and 104 will be trying to pull 36y and 36x low, i.e. NMOS 134 and 144 will both be on, so 36x and 36y will go low, to the common negative supply rail Vss connected to these NMOS. When both D1 and D2 are high, both 103 and 104 will be trying to pull 36x and 36y high i.e. PMOS 133 and 143 will both be on, so 36x and 36y will go high, to the common positive supply rail Vdd connected to these PMOS. However if D1 is high and D2 low, NMOS 134 will try to pull 36y down to Vss and PMOS 143 will try to pull 36x high to Vdd. The respective waveforms are illustrated in FIG. 7b. The voltages on segments 36x and 36y will be determined by a potential divider action depending on the on-resistance of PMOS 143, the resistance of pass device (resistor) 37 and the on-resistance of NMOS 134. If 37 is a resistor of say 5 kohms, and the on-resistance of each of 143 and 134 are say 100 ohms each, then the voltages on 36x and 36y will be within 2% (i.e. 100/(100+5 k+100)) of Vdd or Vss. This degradation of logic noise margin is negligible. Also the current from Vdd to Vss will be limited to (Vdd−Vss)/5 kohm, say 660 uA for a 3.3V logic supply, which will be small compared to the rest of the system in any active mode.

If the resistance of 37 is increased further, the logic levels will be even more solid, and the supply current even less. However there will be parasitic capacitances on the PCB and the logic input, and output buffers will present further capacitance to the bus. If the capacitance of each segment of the bus is say 10 pf, the 5 kohm pass device will give a time constant of 50 ns, giving delayed edges and slow rise and fall times. For a data rate of say 3 MHz (330 ns period, or 165 ns for each half-period) this gives 3 time constants for each 165 ns half-period, which allows the waveform to safely reach above V Input High level (VIH) of the target buffer for a rising edge signal, and below V Input Low level (VIL) of the target buffer for a falling edge signal, so is acceptable. However higher data rates will require either lower resistance pass device or a reduction in the capacitances. This effect is illustrated in the logic waveforms of FIG. 7c and in more detail by the wave shapes of FIG. 7d. This shows the waveform on a data line at maximum data transition frequency, with various resistance or capacitance slowing down the edges. Waveform a is the ideal waveform, with negligible degradation of the edges. Waveform b shows acceptable degradation. For waveform c, the waveform only just reaches VIH or VIL by the end of the data pulse, so is marginally acceptable (in practice some extra margin may be needed to guarantee adequate switching according to set-up or hold times of the subsequent logic). The case of Figure d, represents too high a pass device resistance of the load capacitance, with a waveform never managing to reach either VIH or VIL, giving unpredictable interpretation by the subsequent logic.

On the other hand smaller resistance values could be used for the pass resistor 37, in order to increase the slew rate of the logic waveforms on the bus when passing through the resistor 37. However this will increase power dissipation and reduce the voltage swings on the two parts of the bus. Referring to FIG. 7a, consider the case where PMOS 143 of applications processor 4 is asserting a high logic level on bus segment 36x, to be input to inverter 201 of wireless codec 11, while PMOS 193 and NMOS 194 of audio codec 9 are being switched to alternately assert high and low logic levels on bus segment 36y, to be input to inverter 131 of communications processor 3. When both PMOS 143 and PMOS 193 are on, both segments of the bus will be pulled up to Vdd, giving solid logic signals to the two inverters. However when PMOS 193 is turned off and NMOS 194 is turned on, to try to assert a logic low level on bus segment 36y, the voltages on the bus segments 36x and 36y will be determined by potential divider comprising the on resistance Ron143 of PMOS 143, the on-resistance Ron145 of switch 145, the resistance Rpass of pass device 37, the on-resistance Ron 195 of switch 195, and the on-resistance Ron194 of NMOS 194. Ignoring Ron145 and Ron195 for simplicity (or absorbing them into Ron 143, Ron 194) if say Ron143=Ron194=Rpass/2, then bus segment 36y will be pulled down to Vss+(Vdd−Vss)/4 and bus segment 36x will also suffer a drop in voltage to Vdd−(Vdd−Vss)/4, giving a voltage drop across 37 of (Vdd−Vss)/2. high and low. Provided the voltage level of 36y is less than the VIL (the maximum input voltage threshold required for predictably detecting a logic low input) of 131, and the voltage level on 36x is above VIH (the minimum input voltage threshold required for predictably detecting a logic high input) of 201, proper operation may be obtained. However typically some extra voltage margin will be required to give some noise margin to allow for extraneous noise sources. Also the above calculation needs to be repeated for all combinations of receiving and transmitting drivers, and for all combinations of high and low levels, and also to allow for the effects of manufacturing tolerances, particularly on the on-resistances of the MOS switches. If Rpass is decreased further, the logic levels during contention will be further degraded, until eventually VIH or VIL is no longer safely achievable, and interpretation of the voltages by the input inverters will become unpredictable. Also the current from Vdd to Vss during contention is (Vdd−Vss)/(Ron143+Rpass+Ron194), and will increase as Rpass is decreased. For uncorrelated digital signals on the two segments, there will be contention in one direction or the other for half the time, so this contention current is significant. Also if the voltage levels are hovering around mid-rail, the input inverters attached to the buses will also.

The resistive pass circuit may be implemented by a simple resistor connected to each bus section, or a MOS-based resistor in an Integrated Circuit version for example.

Figure 8A:
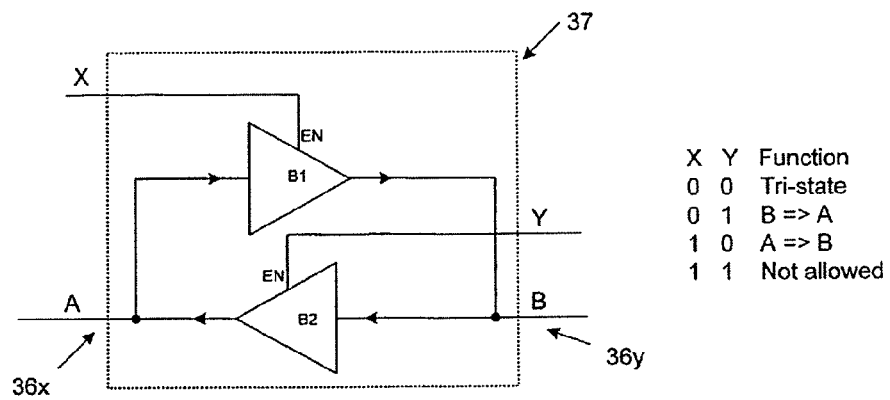
FIGS. 8a, 8b, and 8c are circuit diagrams of active pass devices for the bus of FIG. 4.
Figure 8B:
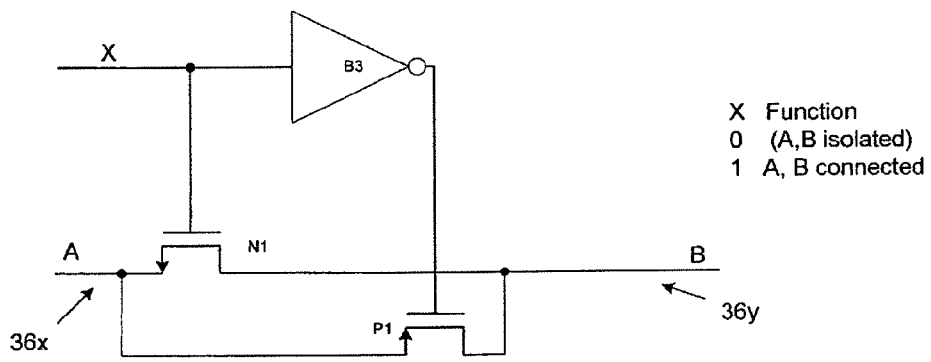
Figure 8C:
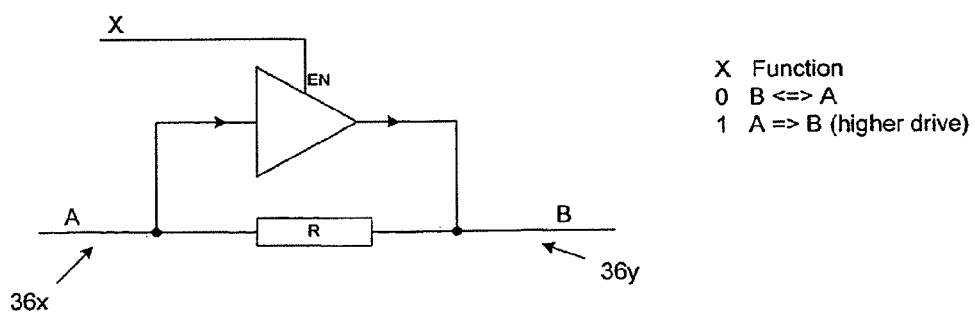

Using a resistor as the pass device 37 is the simplest and cheapest solution. However if high data rate is required, or high capacitance inevitable, or even lower power required, an active pass device may be preferable. FIGS. 8a, 8b, and 8c show three example implementations for pass circuits 37 using active devices (e.g. tri-state buffers, transmission gates or transistor switches). In each case pass circuit 37 will have one or more additional control terminals. These will be driven typically from the applications processor, either directly or possibly via some glue logic. These control terminals on devices within the pass circuit 37 are not shown explicitly in the diagrams for simplicity; however the skilled person would appreciate how control of these active devices may be implemented.

FIG. 8a shows a pass device 37 comprising two tri-state buffers B1 and B2 which are separately switched by signals X and Y from the applications processor 4 for example. The associated state table shows the different states available. Connections A and B are coupled to respective sections (36x and 36y) of the bus 36. When X=Y=0 both B1 and B2 are in a tri-state condition so the overall pass device 37 effectively divides the two bus sections 36x and 36y apart so that they operate separately such that signals on each bus section are isolated from each other. If X is high and Y low, one of the tri-state buffers B1 is "on", whereby a conduction path is provided from one bus section 36x to the other section 36y, effectively unifying the bus sections 36x and 36y into a single bus 36. Similarly if Y is high and X low, one of the tri-state buffers B2 is "on", whereby a conduction path is provided from one bus section 36y to the other section 36x, effectively unifying the bus sections 36x and 36y into a single bus 36. Such an arrangement only allows signals to travel in one direction at a time, i.e. the arrangement assumes a non-duplex signal path, which is the case for a PCM bus which has a separate bus for each direction of signal traffic. Note X and Y both being high is not allowed, since the pair of cross-coupled buffers would then lock up into state A=B=1 or A=B=0. The tri-state buffers B1 and B2 would be similar to the buffers already described with respect to element 103, but being unidirectional they would not require the inverter 131.

FIG. 8b shows an implementation of pass device 37 as a transmission gate with an NMOS and PMOS driven by control signal X and its inverse. If X is low, the two segments 36x and 36y are isolated. If X is high the two segments are connected.

FIG. 8c shows an alternative arrangement utilising a resistor and switched tri-state buffer. This acts in a similar manner to the single resistor implementation described above, but additionally includes the tri-state buffer to boost the conductivity in one direction, for example if 36y presents too much capacitance to be driven through the resistor (of high value limited by desired power dissipation) but 36x presents low enough capacitance to be driven acceptably fast from 36y through the resistor.

Thus utilising a pass circuit 37, it will be appreciated that separate communications can be carried out simultaneously between the communications processor 3 and the audio codec 9, as well as between the wireless codec 11 and the applications processor 4. This is because when both sections 36x and 36y of the shared audio bus 36 are being used at the same time, the pass circuit 37 acts to isolate the two bus sections, substantially suppressing any current that might pass between the two sections, at least to the extent that the bus interfaces (103, 104, 109, 111) of the various circuits (3, 4, 9, 11) can "filter" this out. However in other modes of system operation the pass circuit 37 appears transparent to signals on the bus such that data can be transferred between the communications processor 4, "over" or "through" the pass device 37, to the wireless codec 11 for example, provided that the applications processor 4 output 104 sharing the second segment of the bus is tri-stated to avoid it overriding the signal passed through the pass device.

Therefore by using a passive or suitably controlled active pass circuit 37, together with appropriate control of the bus interfaces, the bus can operate in a unitary or dual mode. This in turn allows for different applications or functions to share the audio bus adding to possible functionality of the audio convergence device or at least efficient implementation of this functionality using this type of audio bus architecture. In other words, this "dual mode" ability of the audio bus 36 provides for additional modes of system operation, and without major modifications to any of the components. Thus it allows for improved functionality within the device, without the need for additional hardware such as an additional audio bus and modified chips implementing the described circuits. (Minor modifications to some existing standard audio codecs might be required to allow some additional signal paths and hence additional functionality as outlined further below, but the processors and Wireless codec would not require changes.) Furthermore there is no need for additional driver software in order to implement this architecture as the interfaces or bus protocols (e.g. PCM) used are unchanged. Furthermore control of the bus interfaces to implement the dual or unitary mode of the bus is inherent in the use of the applications using the bus. The only additional software that is required is related to the applications themselves, as opposed to utilising the dual mode audio bus arrangement. This reduces the integration complexity associated with implementing this additional functionality.

Referring again to FIG. 4a, the communications processor circuit 3 interfaces with radio circuits (1 in FIG. 1) which communicate with cellular (e.g. GSM, GPRS, 3G) base stations in order to provide telephony functionality for the device. Various circuits 3 of this type will be known to those skilled in the art, but an example includes the Intel PXA800x GSM/GPRS communications processor. The communications processor 3 includes an audio signal interface for connecting to the audio signals bus 36. This bus 36 is typically implemented as a PCM bus in order to ensure maximum interoperability with legacy chipsets and minimise latency, but may utilise any suitable protocol as is known.

The wireless codec circuit 11 provides an interface (Over The Air) to other wireless devices local to the Smartphone (e.g. headsets 12 and laptop computer and other remote devices), and also incorporates an audio signals interface (e.g. PCM) or connection in order to interconnect with an audio signals bus 36. The wireless codec 11 uses radio circuits (not shown) which wirelessly interconnect with other devices such as wireless headsets, as is known. Various air interface technologies can be used including Bluetooth and Wi-Fi (IEEE802.11) (or Wi-MAX IEEE802.16), however typically Bluetooth will be used for transmission of audio wireless signals to a wireless headset in order to minimise power consumption, reduce silicon real-estate or size, and reduce cost). Again suitable Bluetooth (or other wireless) codecs will be known to those skilled in the art, for example Texas Instruments BRF6100, BRF6150 and BRF6300 (latest generation)

The applications processor 4 is typically a general purpose processor chip which provides various PDA type functions such as calendar and contact applications, as well as the playback of music or other audio files. The applications processor will also typically control the Smartphone device's screen including recognising input from the user, and the audio output in the sense of implementing the user's commands by controlling the configuration of itself and other devices. The processor 4 is coupled to device memory 2 which stores the calendar and contacts data as well as music (e.g. MP3) and video (MPEG4) files. In addition this circuit 4 has a connection or (PCM) interface with the audio bus 36. An example of an applications processor circuit 4 with a PCM interface is Intel's PXA27x applications processor. More general-purpose processors, without PCM interfaces, may be used in some embodiments disclosed below.

The functions required of the audio codec 9 will vary according to the range of applications required of the system. It may contain a PCM interface for communication via the PCM bus, a DAC for conversion of digital audio signals into analogue audio signals suitable for playing over the device's loudspeaker/headphones 10, and an ADC for converting signals from microphones. It may comprise a separate interface to a data link such as an I²S or Intel AC (e.g. AC '97) for communicating with the applications processor. Also it may contain various digital or analogue mixers and programmable gain stages or multipliers for mixing together various signals as desired. The codec may also provide some digital or analogue filtering or other conditioning of the audio signals.

Depending on the application or mode and on the signal source, data arriving at or sent from the audio codec may be at various sample rates and word-lengths. The digital audio data received from the applications processor 4 will typically be much higher quality (e.g. Hi-Fi) compared with that from the communications processor 3, the latter typically only being a mono 8 kbs of 13 bit words channel for Voice applications (or up to a mono 16 kbs of 14 bit words for Wide-Band Voice), whereas the former will typically be two or stereo 44.1/22.05/11.025 ksps of 16 bit words per channel for Audio applications. In general the codec 9 will need the capability of digital-analog conversion and analog-digital conversion at various bit-widths and sampling frequencies, with mono or stereo operation. This may be by dedicated converters of various performance, connected in the appropriate signal paths. However a reduced number of ADCs and DACs will suffice, connected into various signal paths as required, and either configurable to operate at lower resolution, or just allowed to convert at higher resolution or sample rate with appropriate digital processing to compensate if necessary. By using a reduced number of converters, silicon area will be saved.

In general, in addition to the basic functions of DACs and ADCs for interfacing digital data and the external input and output transducers or other analog signal sources or sinks, the requirements of the audio codec include routing signals to and from its PCM and AC-link interfaces in a configurable fashion, and possibly mixing and scaling such signals or sample-rate converting, in analogue or digital domains.

Figure 4B:
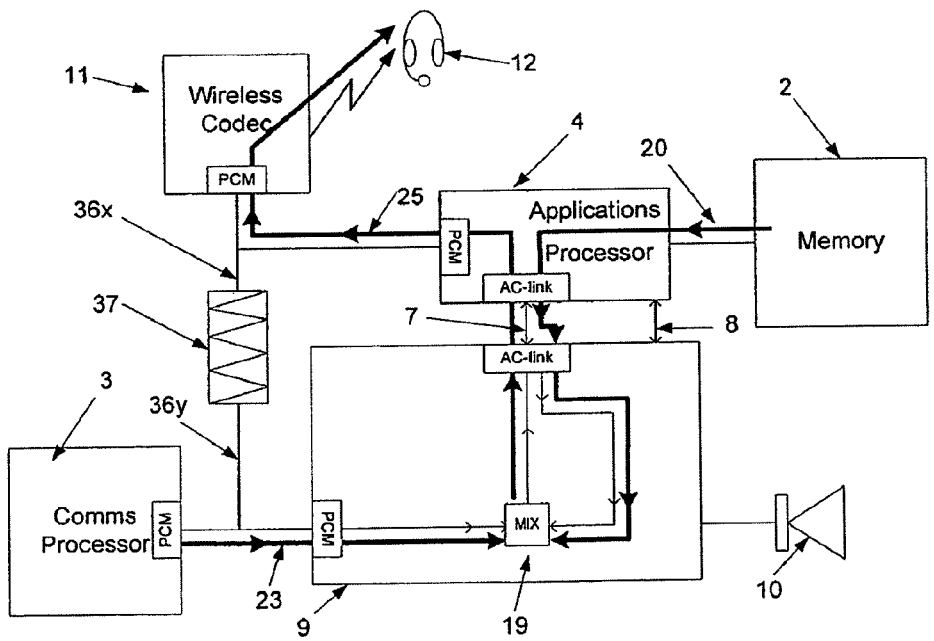
Figure 9A:
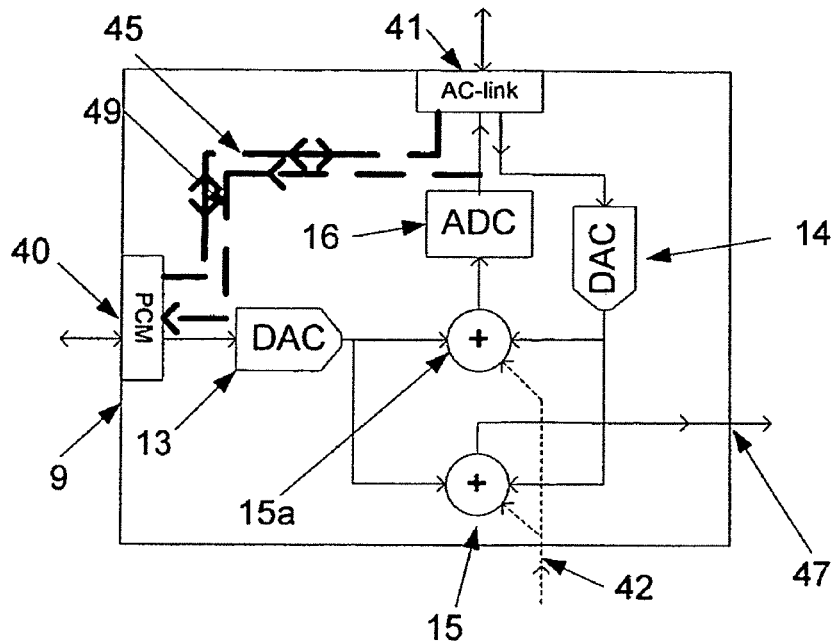
FIGS. 9a, 9b, 9c, 9d, 9e and 9f show examples of the internal components and connection paths of an audio codec

By way of example, FIG. 9a shows components and connections within an audio codec according to an embodiment. It comprises a DAC 13 connectable to convert data (e.g. phone voice) received via a PCM interface 40, and a DAC 14 connectable to convert data (e.g. music hi-fi) received via an I2S or AC'97 interface 41. The DAC output analogue audio signals are mixed by an analogue mixer 15, and can be output via connection 47 to a speaker, either directly or via an on-chip or off-chip power amplifier. Alternatively or additionally the DAC output analogue audio signals may be mixed by an analogue mixer 15a and fed to an analogue to digital converter (ADC) 16. The digitised mixed audio signal (e.g. music playback and phone voice) can then be transmitted via over the AC or I2S interface 41, for example back to the applications processor which may then route this mixed signal to the wireless codec so a user can listen to a voice call from the PCM interface with background music from the incoming AC interface as illustrated in FIG. 4b.

The audio codec will generally contain several ADCs and DACs and other possible signal paths. For instance the ADC output may be output on the PCM bus via link 49, for use by e.g. the communications processor for an outgoing call. Also shown is analogue input 42, representing an input from say an FM radio or other analogue signal source or transducer, which is provided as another input to the analogue mixers 15 and 15a.

The codec 9 may also comprise digital adders and multipliers, and a switching matrix to switch the various on-board components into different configurations in order to implement different audio functions. Thus a digital only signal path, such as 45 and 49 shown in bold in FIG. 9a could be implemented between the two digital audio bus interfaces 40 and 41. This digital only signal path does not include DAC's and ADC's, nor other analogue processing elements or components. This avoids any degradation of the audio signal (e.g. additional thermal noise, distortion, crosstalk from other ambient signals) due to the conversion from analog to digital and back again to digital. It also allows the DAC, mixer, and ADC to be powered down, to save power. (The digital path will be much lower power than the analog path it replaces).

In its simplest form, where the two digital audio bus interfaces use the same sample rate and digital format, the digital audio data is simply transferred from one interface to the other. In practice some simple manipulation or retiming of the signal may be necessary, involving some temporary signal storage such as a FIFO. The digital only signal path may also comprise a digital format conversion function where the two digital audio bus interfaces use different digital formats, for example PCM and AC. This may involve simple operations such as repeating or omitting samples if the input and output data rates are different, or bit-stuffing, or reversing the bit order, or even serial-to parallel conversion, well known to those in the field.

Some embodiments may comprise digital signal processing, for example volume control, digital filtering, or mixing of other signals, or sample-rate-conversion, involving digital addition and multiplication of the signals. This may be implemented using a standard or customised ALU, or it may be by dedicated, hard-wired logic, using techniques well-known in the field.

This simple manipulation or digital signal processing of the signal in the digital only signal path can be performed either by suitable functional or circuitry blocks interposed in paths 45 or 49, or blocks in the other signal paths, as discussed below with reference to FIGS. 9c to 9f.

Figure 9B:
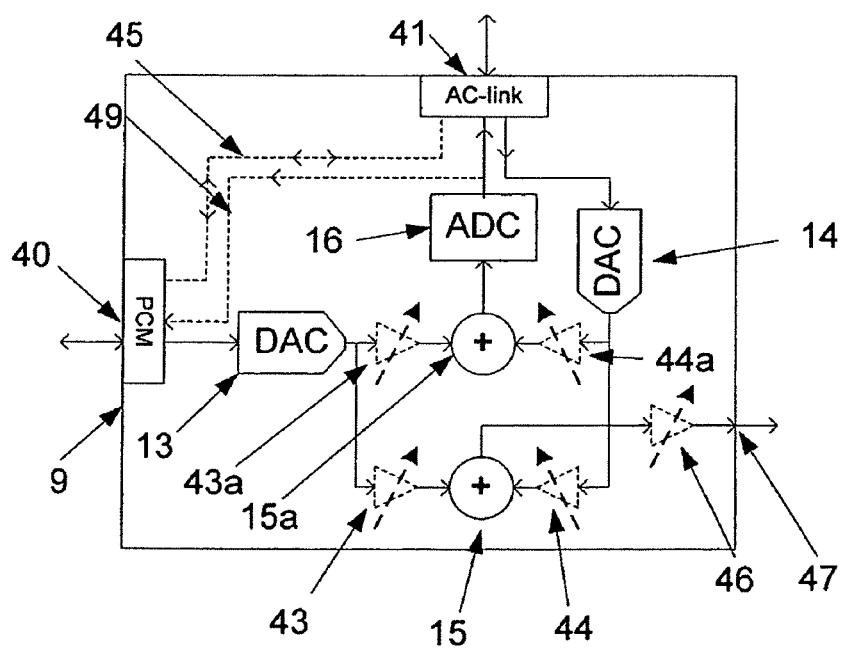

The audio signals can also be adjusted at various points in these signal flows by programmable gain elements 43, 43a, 44, 44a, and 46, inserted as shown in FIG. 9b.

The motivation for converting from digital to analogue and back to audio again, despite the extra power and risk of signal degradation involved, is to cope with different data rates required in different parts of the system. By converting the input digital sampled data to a "smooth" continuous-time analogue waveform, and then reconverting to a new sample rate the input and output data rates can be decoupled as is known. Suitable smoothing filtering can be added easily to the DAC amplifier and mixer functions to make the analogue waveform suitably "smooth".

If the data rates are the same, and if the mixing function is not required in some signal paths, these conversions can be bypassed, for example via digital only paths 45 as shown, and the digital data routed from one digital audio interface 40 to the other 41. As noted above, this will require with some reformatting and retiming to convert the input according to the outgoing bus protocol (AC) and timing for transmission where this is different from the incoming bus protocol (PCM).

Figure 9C:
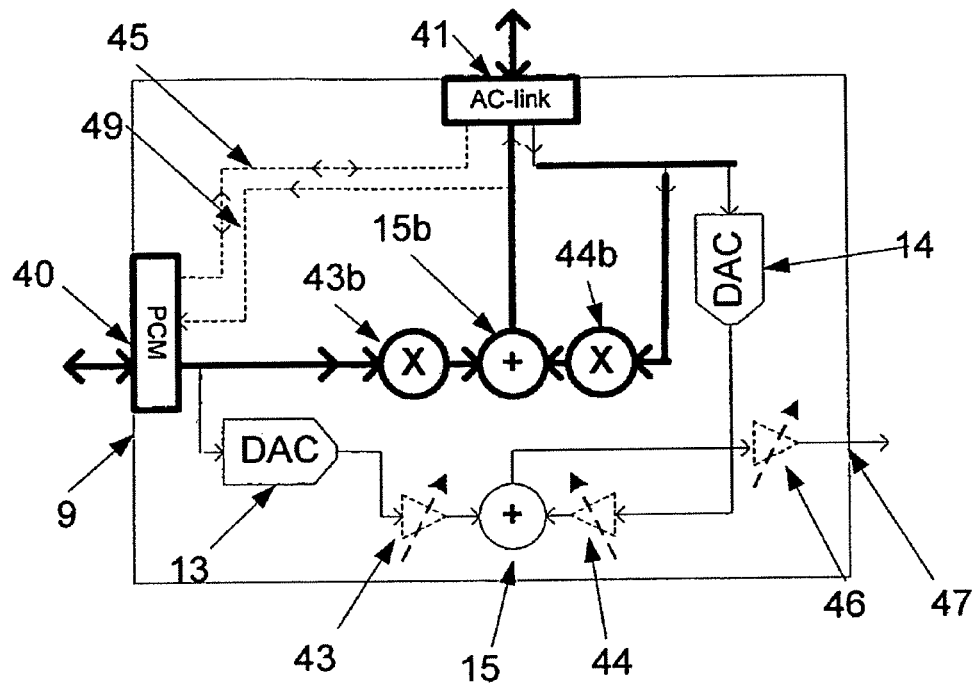

To implement scaling and mixing functions, digital audio signals received from the PCM bus interface 40 (e.g. voice call) and from the AC bus interface 41 (e.g. MP3 music stream) may be multiplied and added in the digital domain, as illustrated in FIG. 9c. The analogue mixer 15a is replaced by a digital adder 15b and the analogue amplifiers 43a and 44a are replaced by digital multipliers 43b and 44b, the DACs and the ADC being removed from the now digital only signal path.

Even if the digital sample-rates are different, there exist known digital techniques for the required "Sample Rate Conversion" (SRC), generally involving conversion to a very high sample rate, low-bit-width representation, using techniques such as delta-sigma modulation or noise shaping for example, and then converting back down using appropriate anti-aliasing filtering, to the required lower sample-rate, higher-resolution format, required as output. Alternatively, for lower cost but lower audio quality, such blocks may just omit or add in extra samples to try and match the bit-rates. These optional blocks are shown dashed as additional SRC elements 48a and 48b in FIG. 9d. One or both of these blocks may be implemented in hardware, or only one SRC may be and which is switched to a chosen input as desired, to reduce cost. Alternatively, all the digital signal manipulation or processing, including SRC, may be undertaken by a common ALU, with signals routed to it as appropriate.

However these techniques tend to be very complex and involve significant digital signal processing. Given the codec already contains DACs and ADCs for other purposes, such as driving speakers via port 47 as shown, the mixed analog-digital solution provides the advantage that it does not impose significant extra cost or complexity.

Further internal routing possibilities exist. For example FIG. 9c shows in bold a digital only signal path through the configurable codec 9 having a digital adder 15b for mixing digital audio signals received from the two digital audio buses 40 and 41. Digital multipliers or scalers 43b and 44b may be used to adjust the magnitude of one signal (for example to reduce background music volume) compared with the other (for example increase the voice call volume).

Figure 9D:
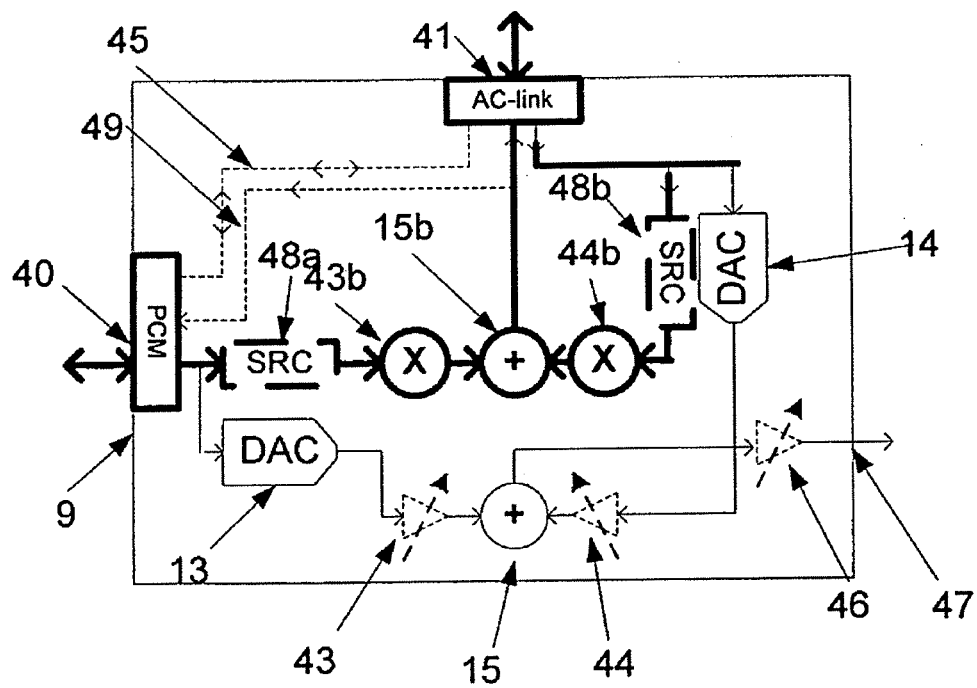
Figure 9E:
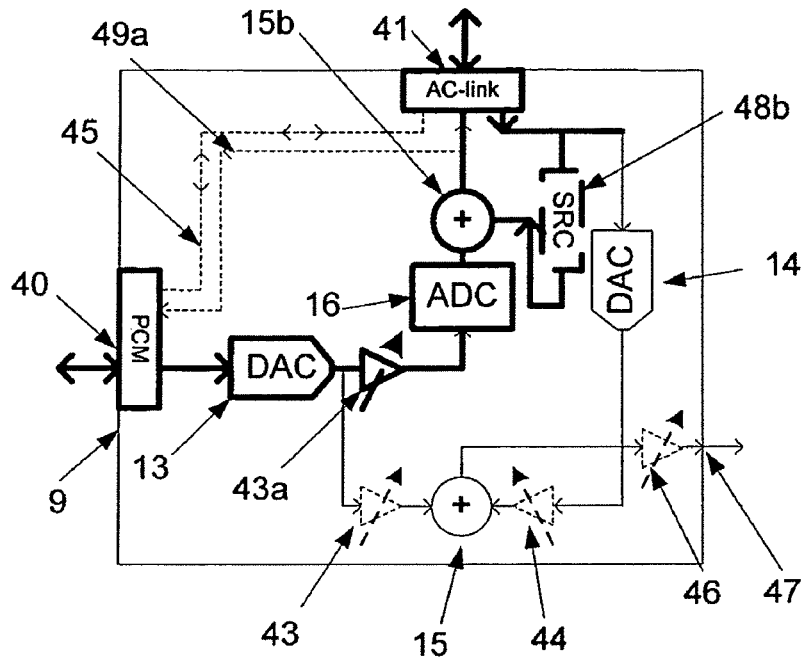

In some applications, the input sample rates presented at interfaces 40 and 41 may be different from each other, or from the required output sample rate of the output from interface 41. For example the input signal at 41 could be a high-quality signal derived from an mp3 file in memory, or a lower-quality recorded message received from memory, but still at a different sample rate from the PCM signal from the communications processor. The output from 41 could be required to be of high quality, when listening to the mp3 file, or low-quality, if this output is merely to be recorded, possibly in a further compressed format, in memory. FIG. 9d illustrates a similar configuration to FIG. 9c but including a sample rate conversion function 48a and/or 48b in one or both of the incoming (pre-mixing) received signals. This allows received digital audio signals at different sample rates to be mixed. A further possibility, not shown in FIG. 9d would be for a SRC block to be inserted between mixer 15b and interface 41, for the case when both input signals are the same sample rate, but the output sample rate is required to be different FIG. 9e shows DAC 13 and ADC 16 connected in series to sample-rate-convert a signal from the PCM interface, which is then presented to adder 15b to mix this signal with one from the AC-link interface, possibly after digital sample-rate-conversion by 48b, and transmit the resulting data back over the AC-link (or over the PCM link via path 49a). Thus one received signal is sample rate converted using the analogue domain, and re-converted to digital before digital mixing with the other received signal. This avoids any degradation of the (possibly high-quality, mp3) audio signal received by 41 due to conversion from digital to analog and back to digital, and the unnecessary power consumption by these conversion, while allowing the possibly lower quality signal input to 40 to be upsampled to a higher sample rate before the digtal mixing. This may be because the codec embodiment does not include digital SRC hardware, or if the on-chip ALU, if any, is already fully occupied performing other tasks. The other received signal (shown from the AC interface 41) may or may not be sample rate converted in the digital domain depending on implementation and design criteria or goals. This SRC function may use up a sole available hardware SRC, or may use up all the capacity of the on-chip ALU, thus requiring the sample rate conversion of the signal from 40 to be performed using DAC 13 and ADC 16 as above. The signal processing path is shown in bold.

Figure 9F:
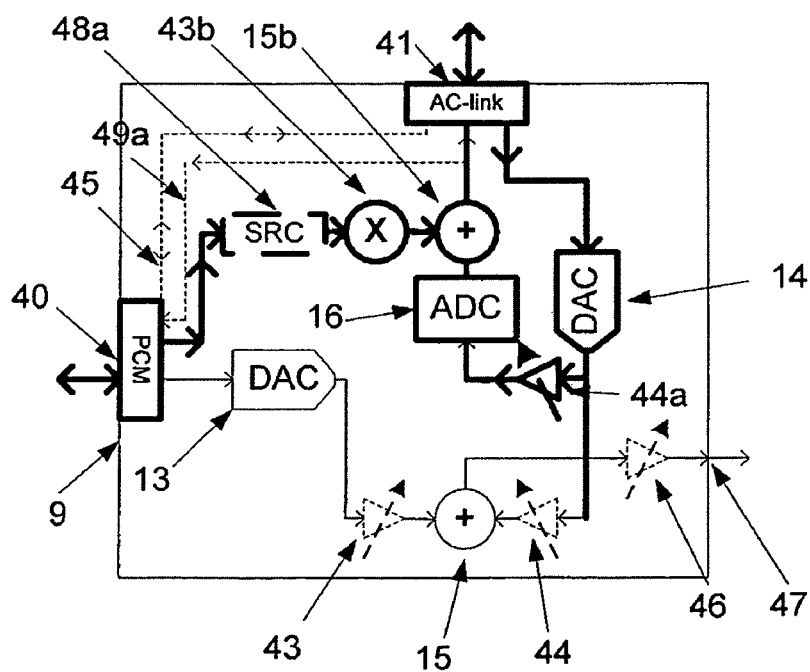

Similarly, FIG. 9*f* shows DAC 14 and ADC connected in series to sample-rate-convert a signal from the AC-link, which is then presented to adder 15*b* to mix this signal with one from the PCM interface, possibly after digital sample-rate-conversion by 48*a* and transmit the resulting data back over the AC-link (or over the PCM link via path 49*a*). This arrangement avoids any unnecessary digital-analog-digital conversion, especially of higher-quality signals, while avoiding the need to add extra SRC blocks or a more powerful ALU to the embodiment, to provide a cost-effective solution. The signal processing path is shown in bold.

It can be seen that these various internal configurations of the audio codec give a wide range of possible combinations of signal routing, analogue or digital sample-rate conversion, ADC or DAC functions. The operational mode of a system using such an audio codec as the hub through which most audio signals pass can thus be programmed largely by the configuration of the audio codec, rather than requiring extra software or hardware associated with components elsewhere in the system.

Figure 10A:
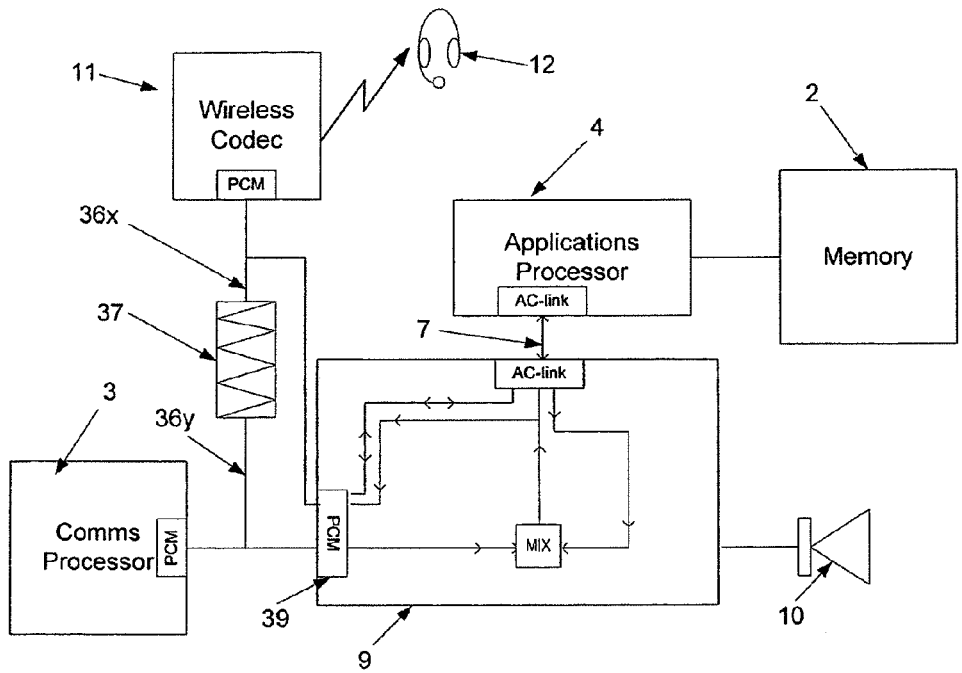
FIG. 10a shows a modified version of the architecture of FIG. 4 in which the audio codec couples to the bus on both sides of the pass device.

Referring briefly to FIG. 10*a*, a codec 9 is shown with three digital audio interfaces, an extra PCM interface 39*a* having been added to couple to the upper bus section 36*x*. This obviates the need for a PCM interface on the applications processor 4. This embodiment is described in more detail below.

Whilst the codec 9 has been described as configurable using a switching matrix, fixed architecture codecs having one of the above described arrangements could alternatively be used, for example for dedicated functions.

A method of operating a digital audio device is described with reference to FIG. 4*b*, in which an application or function is enabled by the structure of FIG. 4*a*. This figure shows how to achieve the application of simultaneous audio playback and voice call reception, in which both audio files stored in memory 2 and a voice call are played to the user on wireless headsets 12. This is achieved in this embodiment by effectively splitting the audio bus into two sections 36*x* and 36*y* with separate communications on the bus between the communications processor 3 and the audio codec 9, and the applications processor 4 and the wireless codec 11 respectively. A voice call is received by the digital audio device, and in this embodiment voice data from a GSM call for example is transferred from the communications processor 3 to the voice codec 9 over the lower PCM bus section 36*y*, as indicated by solid line 23. Additionally another digital audio signal which is not a voice call is received by the device, for example Hi-Fi music or an Audio Alert, and this audio data is transferred from the applications processor 4 to the voice codec 9 over its AC data bus or link 7, as indicated by solid line 20. (In this context, for simplicity, "received" audio data is taken to include the cases where the data is input to the digital audio device some time previously, for example as an mp3 file downloaded over the cellular radio link, or via say a USB connection, or as a message recorded from the Bluetooth headset, or even where a message is stored in a read-only memory or is otherwise defined during manufacture and assembly of the digital audio device.)

The two received signals are then mixed. In the embodiment the audio codec 9 receives the audio data via its PCM and AC-link interfaces, and mixes these, with appropriate analog or digital gain control and mixing, and sample-rate conversion in analogue or digital domains, as described above, to produce output digital audio data or a mixed signal which is transmitted over the AC '97 interface and link 7 to the applications processor 4. The applications processor 4 then transfers this data to the wireless codec 11 over the upper PCM bus section 36*x*, as indicated by line 25; and the mixed digital audio data or signal is then transmitted wirelessly to another device such as the headset 12.

Thus although audio data is being simultaneously carried over bus sections 36*x* and 36*y*, the pass device 37 ensures that these are carried separately. If the music file finishes, or the user wants to stop listening to it, then the communications processor 3 may resume transfer of voice data directly to the wireless codec using both bus sections 36*x* and 36*y* with the applications processor output tri-stated.

The dual mode audio bus allows use of single PCM interface wireless codecs when mixing communications side (e.g. GSM voice calls) and applications side (e.g. MP3 playback) audio data streams. This allows lower power consumption, reduced CPU overhead, less new software development. Indeed no software development is required on the communications side, and new software is introduced only for new features on the applications side, with minimum effort as it only controls the codec and is not doing any additional audio signal processing. Furthermore there are reduced hardware costs compared with say a more expensive dual PCM interface wireless codec and dual PCM or other bus.

In the embodiment of FIG. 4*b* the audio codec 9 re-digitises the mixed analogue signal at the wireless codec's sampling rate which is typically 8 kHz. This data is then transferred from the applications processor's PCM interface to the wireless codec 11. This can be achieved using a direct memory access (DMA) rather than using generic software code, in order to minimise loading of the applications processor 4. The DMA routine seamlessly transfers incoming data from the applications processor's AC-Link FIFO buffer (coupled to the AC data link 7) to the FIFO buffer for outgoing data at the PCM interface. Since the applications processor must already be active for applications side playback (e.g. MP3), this simple task does not noticeably affect its power consumption.

Whilst in the embodiment the application of mixing a voice call and a non-voice call and transmitting the mixed digital audio signal wirelessly has used the split bus architecture of FIG. 4*a*, other digital audio device architectures could alternatively be used. For example two separate buses could be used, or an additional codec employed. The embodiment however achieves this functionality with reduced power consumption, complexity and modifications to existing parts.

In an alternative embodiment illustrated in FIG. 10*a*, the audio codec 9 may be arranged to connect to the PCM bus 36 both above (x) and below (y) the pass device(s) 37 in order to provide its output signal directly to the wireless codec 11 rather than via the applications processor. This requires added complexity from the audio codec 9, but simplifies the applications processor 4 requirements, for example by removing the need for a PCM interface. The second PCM output of the audio codec can be implemented by routing the ADC digitized word into the PCM interface as per track 49 in FIG. 9*a* or 9*b* and transmitting this data via another pin on the audio codec, which is then connected to the upper section of the PCM bus 36*x*. Usually no extra clock pins will be required, since the clock lines in the top and bottom segments of the bus will not be isolated by pass devices, so just an extra data pin rather than a complete extra PCM interface is required in audio codec 9. However it would be possible if desired also to have pass devices in the clock lines to allow separate clock domains, at the expense of extra circuitry and pins needed to generate and output the second set of clocks.

Examples of applications enabled by the structure of FIG. 10*a* are now described with reference to FIGS. 10*b* and 10*c*.

Figure 10B:
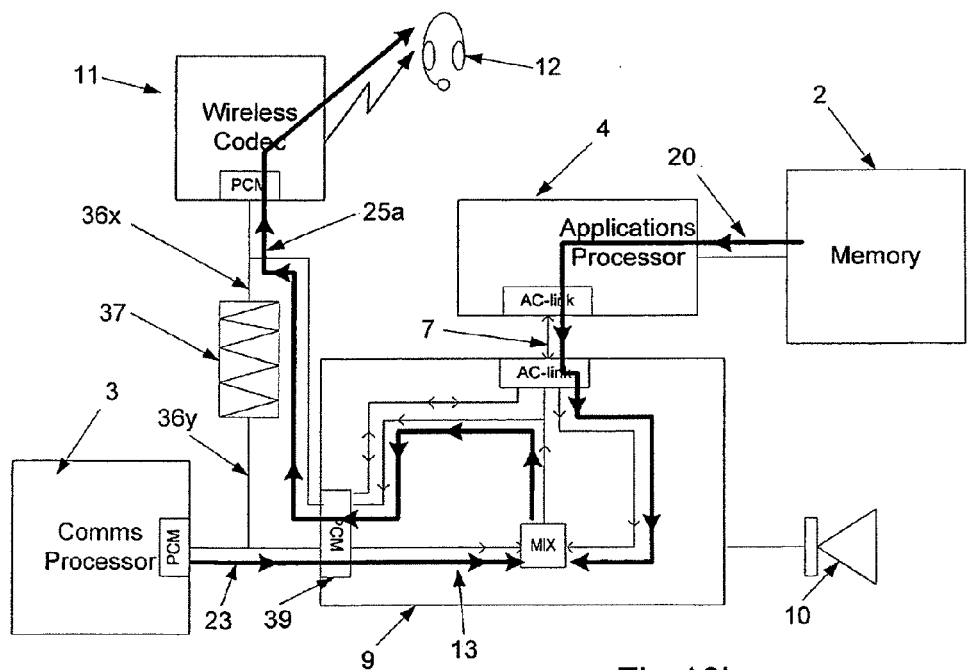
FIGS. 10b and 10c show applications using this modified bus architecture.

FIG. 10*b* shows a method of operating a digital audio device in order to mix and wirelessly transmit two received digital audio signals, and is similar to FIG. 4*b*, where background music from memory is mixed in with a received voice call. However the triple digital audio interface audio codec 9 of FIG. 10*a* is used, which obviates the need for a PCM or other audio bus interface on the applications processor 4. The signal flows are similar, except that data travels from audio codec via path 25*a* directly onto the upper PCM bus 36*x*, in place of through the applications processor via path 25 of FIG. 4*b*.

Where an input to the applications processor chip from the PCM bus is needed, this audio is received by the audio codec 9 and forwarded to the applications processor 4 via the I2S or AC interface 7. The digital only signal paths described above with respect to FIG. 9 can be used to efficiently transfer the digital audio data or signals between the digital audio bus interfaces.

Figure 10C:
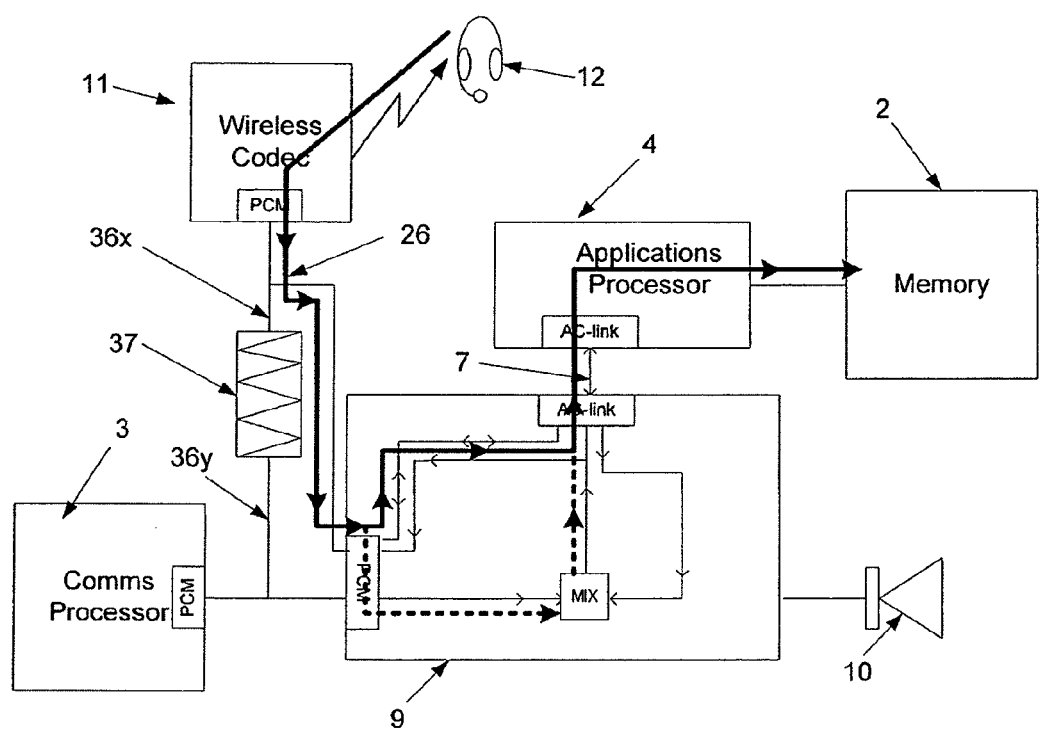

FIG. 10*c* shows a "Voice Dictation" application or method of operating a digital audio device where a received wireless digital audio signal from another device is routed via the audio codec 9 to the applications processor. In the embodiment an incoming digitised voice from the wireless codec is transferred to memory, possibly after some compression (for 'Voice Dictation' applications for example). The signal path 26 flows from the wireless codec via the PCM bus and the audio codec's second PCM data pin into the audio codec, where it is routed (and retimed and reformatted as required) for transmission on the AC '97 bus to the applications processor. Thence it is written to memory (possibly after some data compression algorithm within the application processor).

The above embodiments have only been described with respect to one data wire in the PCM bus, and hence signals only propagating in one direction at any one time on each segment of the bus. Usually however a PCM bus will comprise two data wires, allowing data propagation in both directions simultaneously, i.e. duplex operation, as in FIG. 2*b*.

Figure 11A:
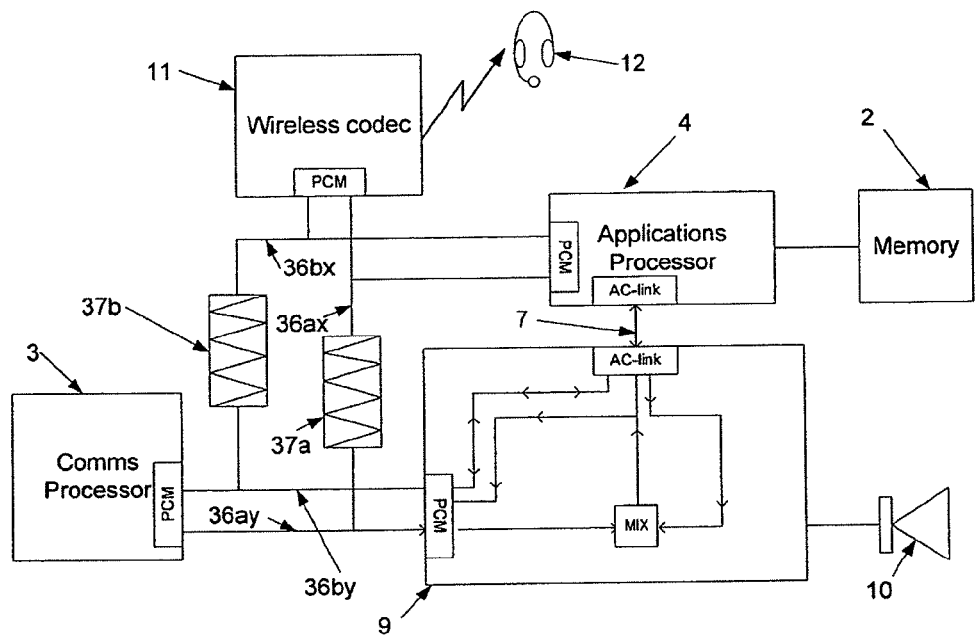
FIG. 11a shows a bus architecture similar to FIG. 4 but comprising a duplex bus.

FIG. 11*a* illustrates the structure of a practical duplex bus 36, having two pathways 36*a* comprising 36*ay* and 36*ax* and 36*b* comprising 36*bx* and 36*by* and respective pass devices 37*a* and 37*b*, as also shown in FIG. 5*c*.

Methods of operating a digital audio device or digital audio applications enabled by the structure of FIG. 11*a* are now described with reference to FIGS. 11*b*, 11*c*, and 11*d*.

One application enabled by the duplex bus is duplex voice calls, using the wireless headset to receive an incoming call while continuing to listen to background music, in a similar fashion to the application of FIG. 4*b*, but with the capability of simultaneously sending outgoing audio messages using the headset microphone. Referring to FIG. 11*b*, it can be seen that the user's voice is transmitted directly from the wireless codec 11 to the communications processor 3 over both sections of the second bus 36*bx* and 36*by* (and the pass device 37*b*) via the path 32 illustrated by the dashed line. However, in a similar fashion to FIG. 4*b*, the caller's voice is transmitted from the communications processor 3 first to the audio codec 9 via path 23 over the lower section (y) of the first bus 36*ay*, where it is mixed with audio from memory 2 via path 20 before being transmitted from the applications processor 4 to the wireless codec 11 via path 25 over the upper (x) section of the first bus 36*ax*. Thus the first pass device 37*a* effectively separates the bus sections 36*ax* and 36*ay* of the first bus 36*a*, but the second pass device 37*b* effectively combines the bus sections 36*bx* and 36*by* of the second bus 36*b*. The local codec 9 must of course be controlled to tri-state its output onto 36*by* to allow the wireless codec microphone signal to pass through 37*b* over to the communications processor 3.

Figure 11B:
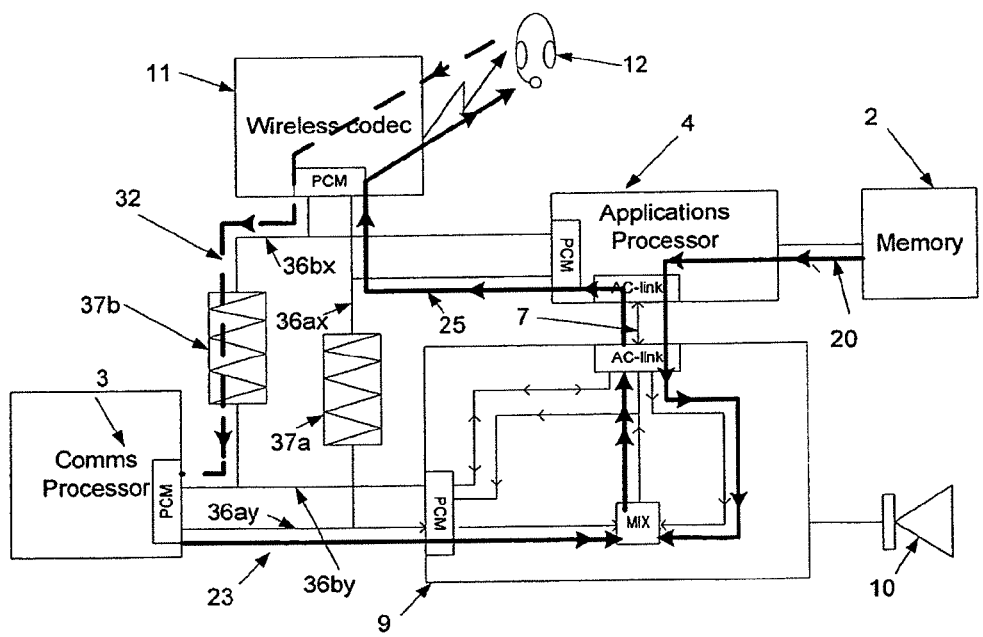
FIGS. 11b, 11c, 11d, 11e show applications using this duplex bus architecture.
Figure 11C:
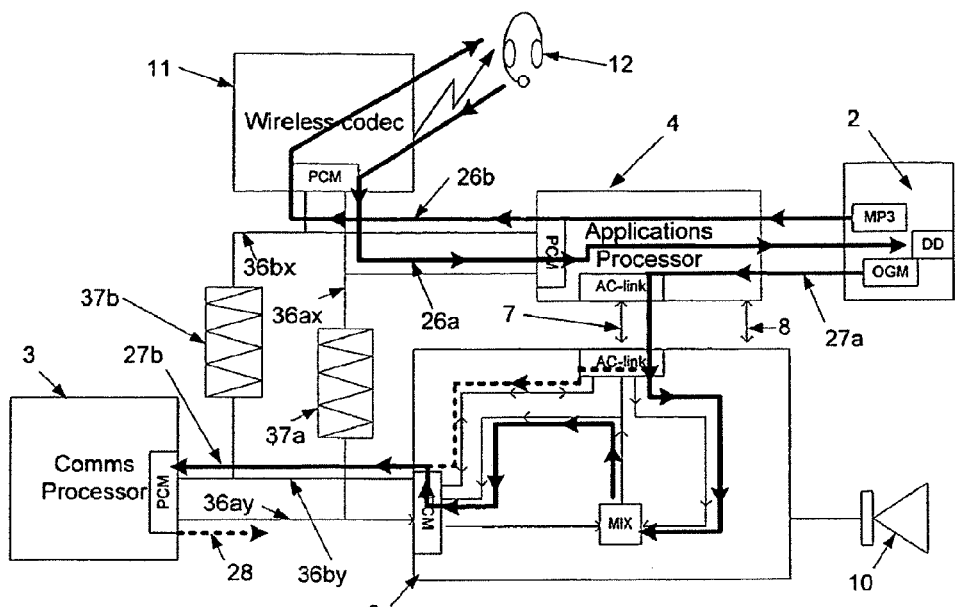

FIG. 11*c* illustrates another method of operating a digital audio device in which a received wireless digital audio signal such as digital dictation is stored on the device, another digital audio signal such as MP3 music is wirelessly transmitted, and a third digital audio signal such as an outgoing message is transmitted in response to a voice call. This embodiment uses the architecture of FIG. 11*a*, in which the user of the device (e.g. Smartphone) is using a digital dictation (DD) application in which audio data from the wireless headset 12 is recorded in memory 2, while music (e.g. from MP3 files) or other audio data is played back over the wireless headset. The system is configured such that the device may also respond to an incoming call from the communications processor 3 by playing a previously recorded automated answer-phone or voice-mail type outgoing message (OGM) from memory 2.

The user's voice is transferred from the wireless codec 11 to the applications processor 4 and memory 2 for recording via path 26*a*, and additionally audio data is transferred via path 26*b* from the memory 2 and applications processor 4 to the wireless codec 11 for playing to the user. These transfers 26*a* and 26*b* take place over the upper sections 36*ax* and 36*bx* of the audio buses 36*a* and 36*b*. The outgoing message (OGM) stored in memory 2 is transferred to the audio codec 9 by the applications processor 4 (line 27*a*). If sample-rate conversion is required, the path through the audio codec 9 may include passing through a DAC 14 and ADC 16 or a digital SRC 48*b* as discussed above. Otherwise the data may be transferred in the digital domain from AC-link interface to the PCM interface across an internal path such as 45. The OGM, suitably re-digitised if necessary, is then transferred from the codec 9 to the communications processor 3 over the PCM bus 36*by*, (path 27*b*) for playing to the caller.

Far end voice signals (shown as dashed line 28) from the communications processor 3 (e.g. talking or background noise at the caller end) are ignored.

Figure 11D:
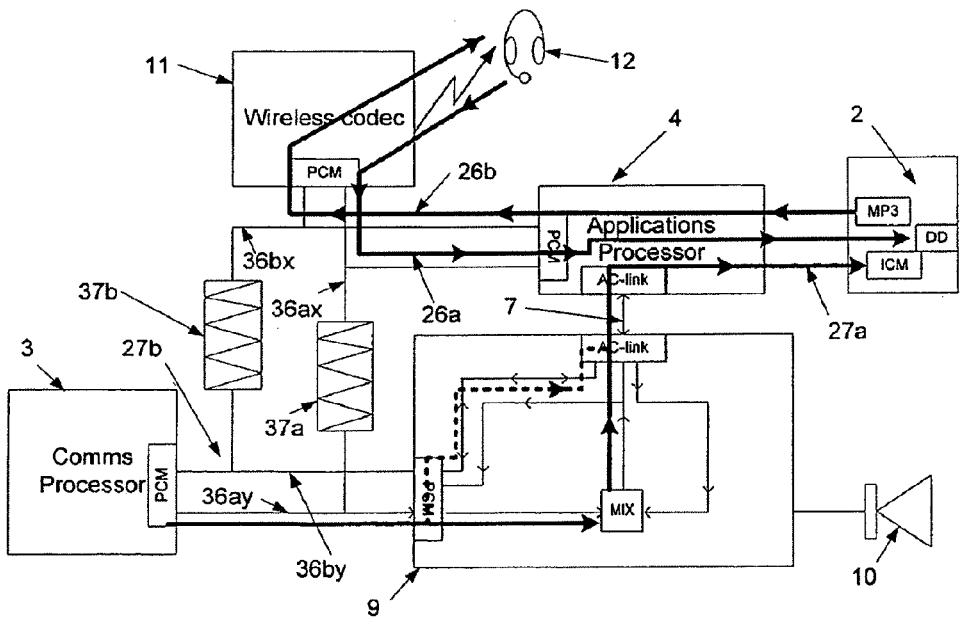

FIG. 11*d* shows a similar application, but in this case the third digital audio signal is a received or incoming voice call message and is stored or recorded in memory, without disturbing the user, who is dictating and listening to music. The incoming message passes through the audio codec either directly (via the dotted by-pass path 45) or via a DAC/ADC or digital sample-rate conversion.

Figure 11E:
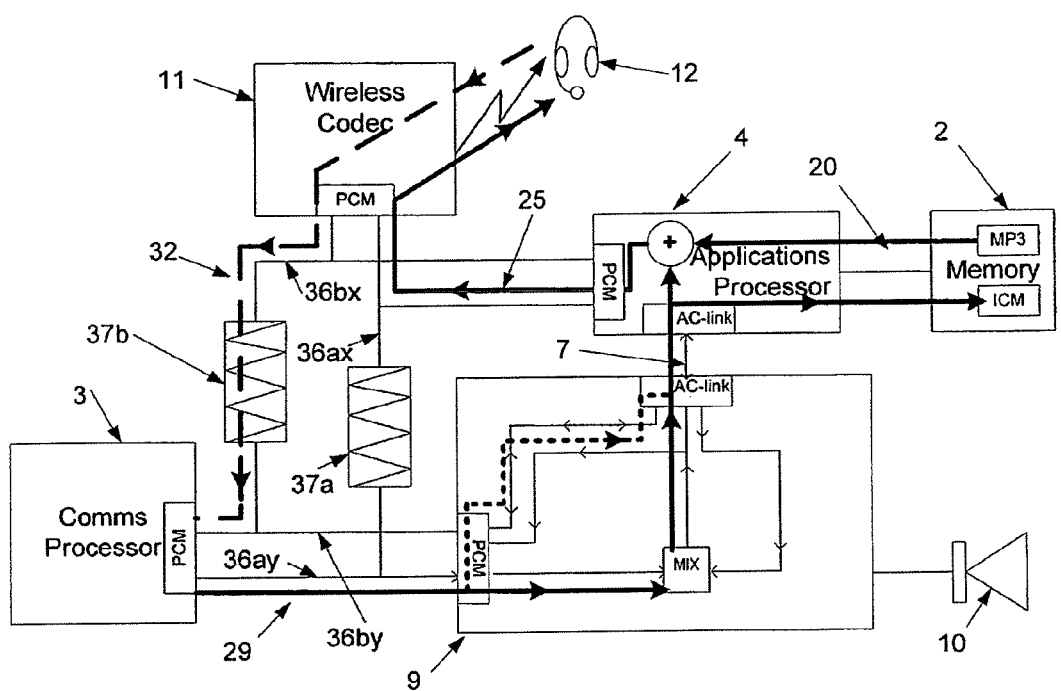

FIG. 11*e* shows a further "call screening" type application in which music or other audio files (the second digital audio signal) are played back to a user of the device over wireless headsets, and this is mixed with the third digital audio signal such as an incoming message (ICM) from a caller so that the user can decide whether to answer the call or just record the incoming message. An incoming message or voice data is sent from the communications processor 3 to the audio codec 9 over the PCM bus 36*ay* (lower section) (solid line 29). This message (ICM) may be in response to the OGM from the application of FIG. 6 for example. The audio codec passes this signal across the AC-link to the applications processor, which stores the incoming message (ICM) in memory 2, possibly after compressing this data.

The application processor also retrieves audio data (e.g. MP3 music files) from the memory 2 via path 20, and converts this data to suitable digital audio signals, which are then transferred to the wireless codec 11 via path 25 over the PCM bus 36*ax* (upper section). The application processor may also digitally mix in the incoming message, so that the signal on path 25 is a mix of both the music and the incoming message. The combined signal is then played to the user over the wireless headsets 12, so that the user can decide whether to answer the call or not, or just to record it, or to ignore it altogether.

The sample-rate of the data from the communications processor 3 will generally be different and lower than that of the hi-fi audio data retrieved from the memory 2. If the incoming message is only to be recorded, then the audio codec can send this data at the original low data rate across the AC-link, to be processed at this low data rate by the applications processor. This avoids consuming power in the audio codec due to analog or digital sample-rate conversion, and also reduces the computing bandwidth required of the applications processor 4 in its compression, or vocoder, operations. If the signals are to be mixed however, either the sample-rate conversion up to the hi-fi sample rate needs to be activated in the audio codec, or some relatively crude (but possibly adequate for communications-quality audio) sample-rate conversion, (e.g. just repeating samples until updated) will be necessary in the applications processor, requiring extra software and power consumption in the applications processor 4.

The communications processor 3 can be arranged to ignore an outgoing signal (i.e. mute near-end) from the wireless codec 11 (indicated by dashed line 32) in order to prevent any near-end voice (from the wireless headset 12 microphone for example) from being heard at the far end (ie on the voice call). The communications processor can then be arranged to accept these voice signals (32) in order for the user to answer and intercept the call (i.e. un-mute), which may be carried on with or without the audio file from memory still being played back depending on configuration of the device or the user's preferences.

It will be apparent that numerous other applications could also benefit from the dual mode nature of the audio bus 36, so that audio data from many other applications (e.g. Karaoke, with the microphone used by third parties) could be transferred simultaneously over the audio data bus, for example to play mixed audio data from different applications to a user; especially over a wireless connection. Another example is an FM receiver or other external audio source furnishing analogue signals to the local codec 9 which are then digitized to be transferred to the wireless codec 11 with or without other voice/audio signals.

It will also be apparent that these digital audio applications or methods of operating digital audio devices may be implemented using other architectures, for example separate digital audio and/or control buses and/or additional codecs. These digital audio applications are therefore not limited to the split mode audio bus architecture described above, but could be implemented on different digital audio devices.

Figure 12A:
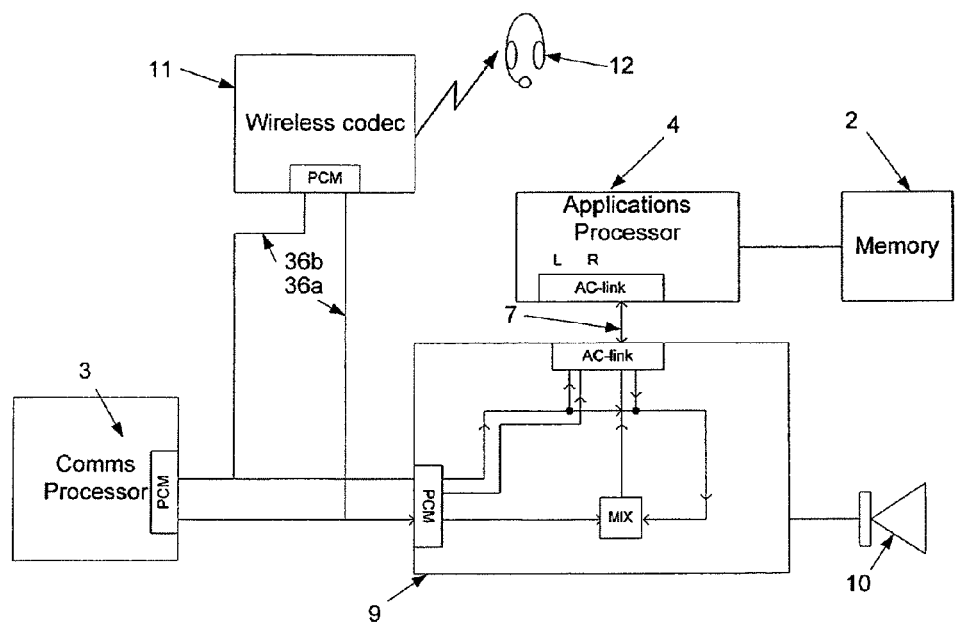
FIG. 12a shows architecture where the audio codec may monitor both directions of data on the dual bus.

FIG. 12*a* shows a duplex PCM bus configuration. The PCM bus inputs of the audio codec are both set to receive signals on the duplex bus wires. There is no direct connection from the applications processor 4 to the PCM bus 36*a* and 36*b*. No pass elements (e.g. 37, 37*a*, 37*b* from previous figures) are shown, and this can be implemented by operating the bus in unitary mode, or using a standard bus without pass elements.

In some applications it is advantageous for the applications processor 4 to process the two (incoming and outgoing) audio signals separately. The AC97 AC-link interface operates with tagged time slots, including one normally assigned to output data from the Left channel or the (stereo) ADC and one to the right channel, as described earlier with reference to FIG. 2*b*. So the incoming signals can be routed digitally so for example the near-end signal is communicated on the left ADC slot and the far-end signal is routed on the right ADC slot. This further extends the audio applications that may be implemented using the shared PCM audio bus architectures described—further examples are given below.

Figure 12B:
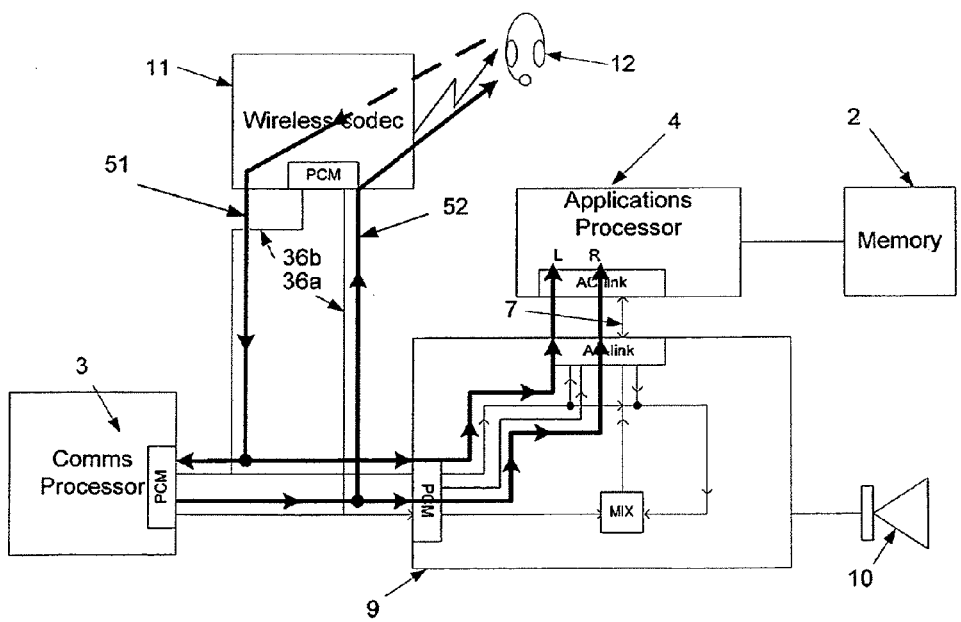
FIGS. 12b and 12c show applications using this mode of operation.

FIG. 12*b* illustrates a method of operating a digital audio device to communicate a duplex voice call with another device (caller) and with a wireless other device, and to simultaneously independently record each half of the duplex call. The audio codec 9 simultaneously delivers to the applications processor 4 both near-end audio (e.g. voice from the user headset 12 to the communications processor 3 over PCM interface 36*b*) and far-end audio (e.g. voice from the caller/communications processor 3 to the wireless codec 11 and user headset 12 over the PCM interface 36*a*) signals. The near end signal path is referenced 51 and the far end signal path is referenced 52.

By supplying both voice streams (near and far end or transmitting and receiving) of a voice call to the applications processor 4, new audio applications or functionality are enabled. For example, this allows a voice call (both caller and user voices) to be recorded into memory 2 by the applications processor. This can be achieved without having to implement mixing of the two channels by the communications processor 3 and transfer of this mixed signal to the applications processor 4 over a serial interface (e.g. UART 5 of FIG. 1). This in turn means that no special communications processor drivers are needed to implement this functionality, and that the quality of the voice signals is maintained. Further there is a much reduced processing load on the communication processor 3 as it no longer needs to mix the signals.

Alternatively the two voice signals could be mixed in the audio codec 9 and delivered over only one AC channel on the AC link. Whilst this may reduce audio quality slightly, it does free up one of the AC channels for other applications. This also reduces some processing load of the application processor 4 as the mix of the signals is done in the codec 9. Also the separated streams (Near End separated from the Far End) enable additional enhancement processing for each stream by itself if desired (e.g. remove Far End signal from Near End one to provide echo removal, noise suppression on Near End for digital dictation applications; enhanced streams before compression and storing in memory)

Also the use of two AC channels on the AC-link 7 to deliver voice to the applications processor 4 further allows additional functionality as the unmixed audio or voice channels can be used separately by the applications processor. For example whilst recording the voice call (both near and far end), the near end voice (from the wireless headset 12) may separately be used for voice activated functions such as voice activation menu or voice memo pad.

This is described in more detail with reference to FIG. 12*c*. The near end signal (path 53) is routed directly using one slot of the AC link 7 (path 53*a*), and is also mixed (path 53*b*) with the far-end signal (path 54), in digital or analogue domain, and sent across another slot on the AC-link (path 55). Again a wide range of analogue or digital sample rate conversion modes are available according to the choice of internal configuration of the audio codec.

Figure 12C:
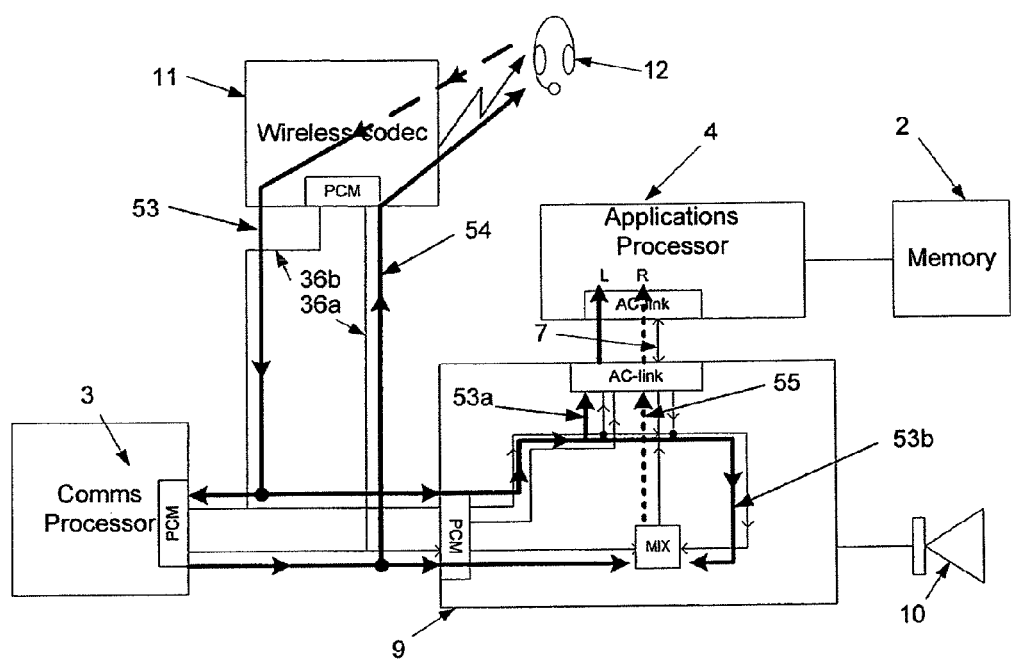

Note that the features just described in FIGS. 12*b* and 12*c* can be achieved both with and without the pass devices 37*a* and 37*b*, so that a reduced audio application set (including the applications of FIGS. 3*b*, 3*c*, and 10*c* for example but not for example those of FIGS. 4*b*, 10*b*, 11*b*, 11*c*, 11*d*, 11*e*) may be implemented on non-dual mode audio bus architectures. However it is apparent that the dual mode audio bus allows many extra functions at little expense.

Figure 13A:
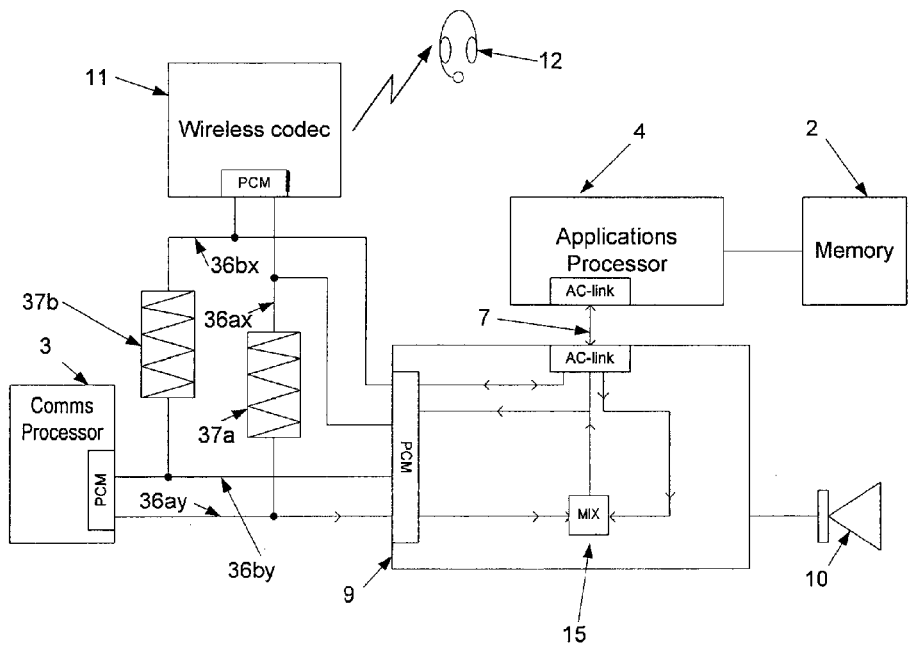
FIG. 13a shows a modified version of the architecture of FIG. 11a in which the audio codec couples to the bus on both sides of the pass device.

FIG. 13*a* shows connections on the PCM bus in the case of a duplex bus 36 where the audio codec 9 has a dual PCM interface 9*a* to a dual mode PCM bus, i.e. 4 data wires in total, two for each part of the bus, and where there is no PCM link from the applications processor 4 to the PCM bus 36. This is similar to the architecture of FIG. 10a, but using two or duplex data buses instead of just one.

Figure 13B:
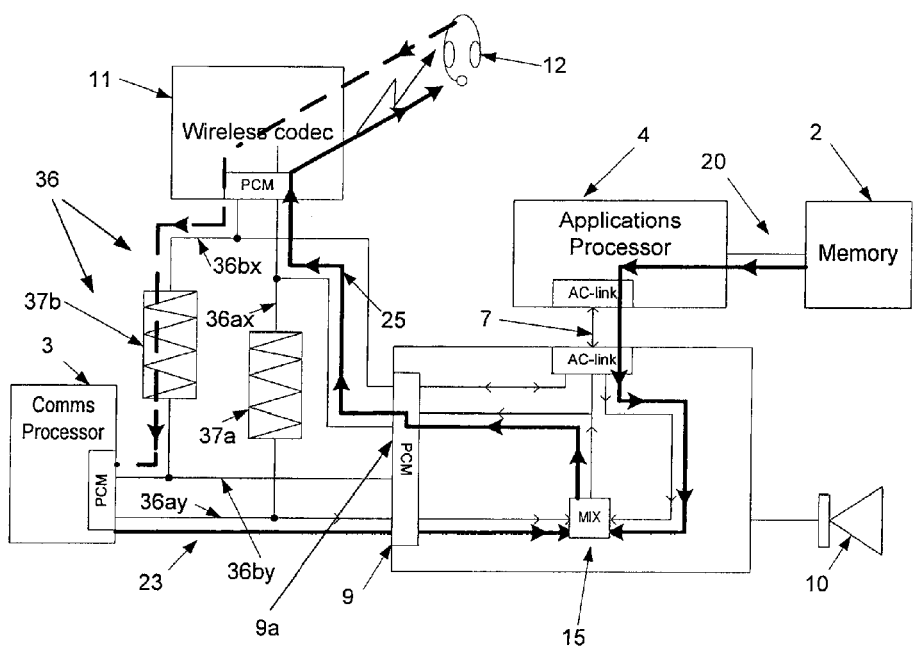
FIGS. 13b, 13c, 13d, and 13e show applications using this modified bus architecture.

FIG. 13b shows the signal flow for the application similar to that discussed in relation to FIG. 11b. Signal flow is very similar, except that the output 25 from the audio codec to the wireless headset now passes directly from the audio codec 9 across the PCM bus 36ax rather than via the AC-link 7 and the applications processor 4.

Figure 13C:
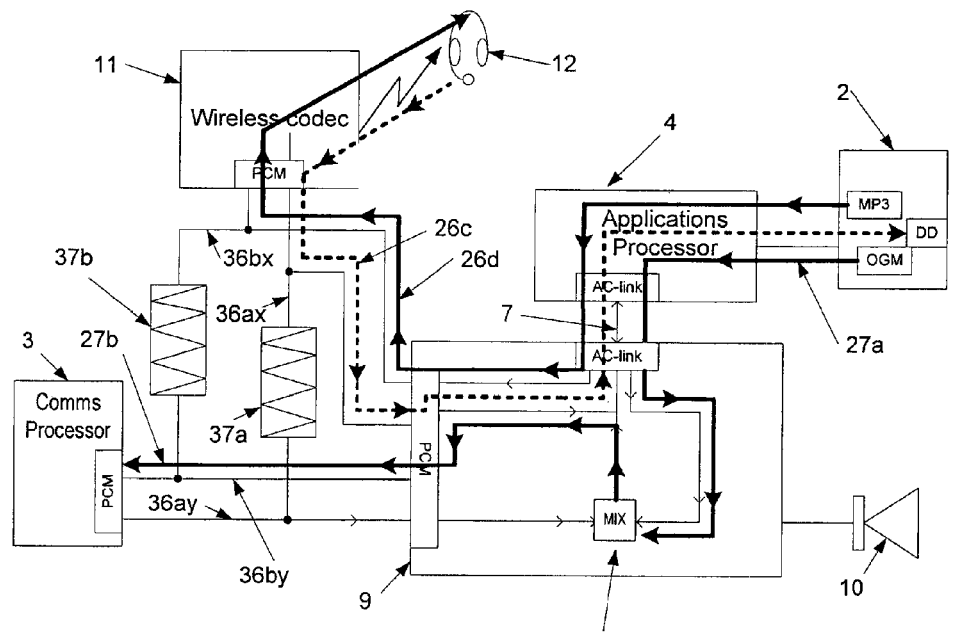

FIG. 13c shows the signal flow for the application similar to that discussed in relation to FIG. 11b. Signal flow is very similar, except that the output 26d from the audio codec to the wireless headset 12 now passes directly from the audio codec 9 across the PCM 36bx bus rather than via the AC-link 7 and the applications processor 4. Similarly the signal flow 26c from the wireless headset 12 passes directly to the audio codec 9 across the PCM bus 36ax. Thus three signal flows pass between the audio codec 9 and the applications processor 4, however these can all be accommodated on the single AC bus, which as described previously includes multiple channel capability using time divided slots. Three such slots or AC channels are used in this application, one of each mapped respectively to an incoming and outgoing PCM channel on one of the PCM interfaces, and to an incoming channel on the other PCM interface.

Figure 13D:
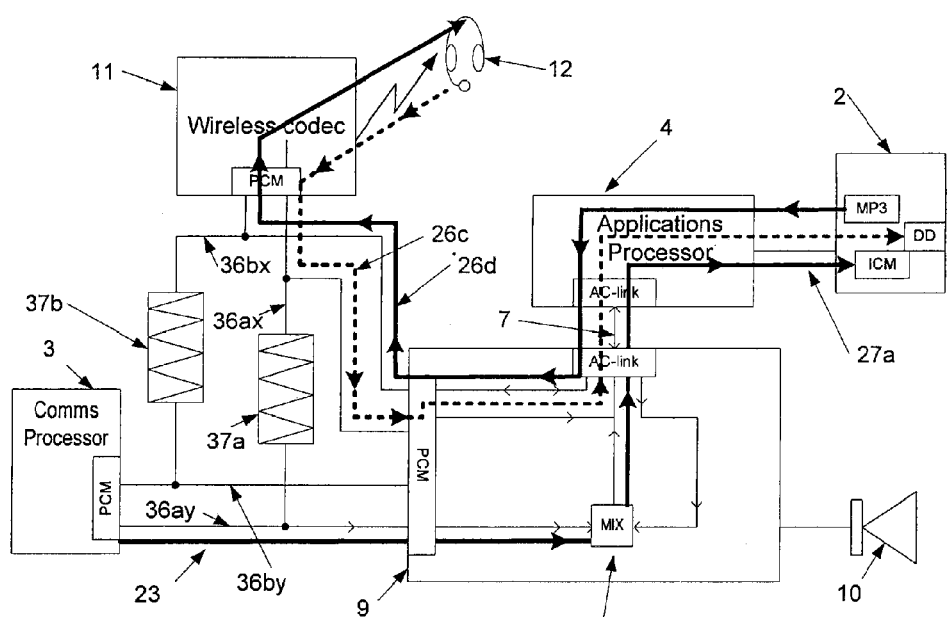

FIG. 13d shows the signal flow for the application similar to that discussed in relation to FIG. 11d. Signal flow is very similar, except that the output 26d from the audio codec to the wireless headset now passes directly from the audio codec across the PCM bus rather than via the AC-link and the applications processor; and the signal flow 26c from the wireless codec 11 to the audio codec 9 passes directly through the PCM bus 36ax to the audio codec rather than through the applications processor 4.

Figure 13E:
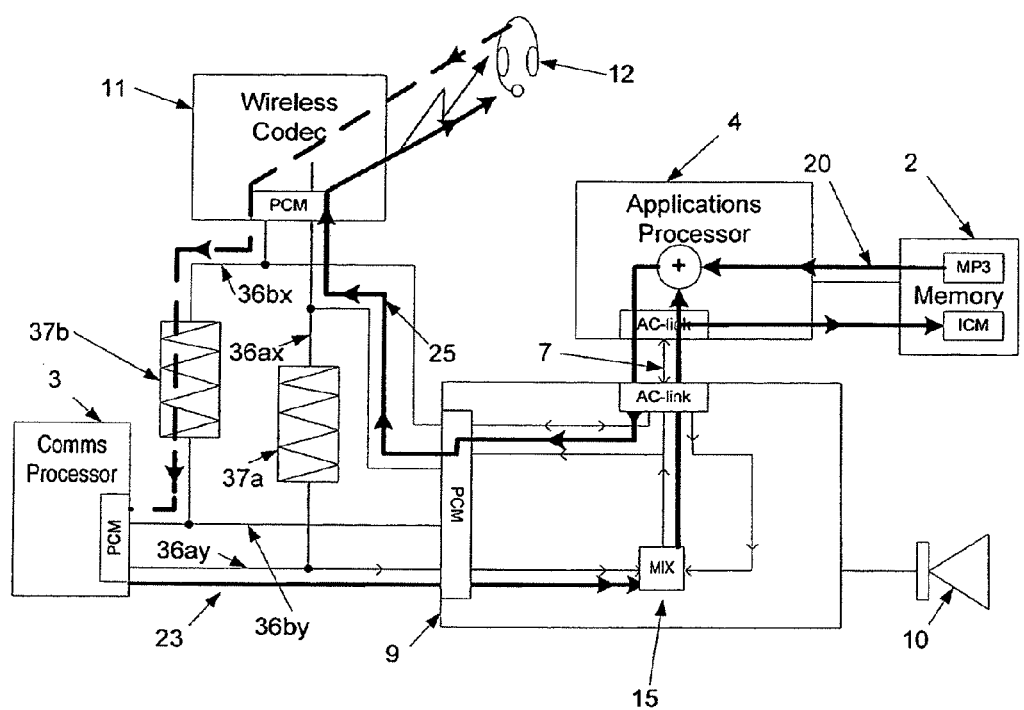

FIG. 13e shows the signal flow for the application similar to that discussed in relation to FIG. 11e. Signal flow is very similar, except that the output 25 from the audio codec to the wireless headset now passes directly from the audio codec across the PCM bus rather than via the AC-link and the applications processor.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language) and their analogue extensions. As the skilled person will appreciate, the code may be distributed between a plurality of coupled components in communication with one another. Where appropriate, the embodiments may also be implemented using code running on a field-(re)programmable analogue array or similar device in order to configure analogue hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. A digital audio device comprising an audio codec for converting digital audio signals to analogue audio signals, wherein:
the audio codec comprises:
first, second and third digital audio bus interfaces for coupling to respective bidirectional digital audio buses or bus sections; and
an adder operable to add together a digital audio signal received from said first digital audio bus interface with a digital audio signal received from said second digital audio bus interface to form a combined audio signal,
the audio codec being operable to transmit the combined signal from one of said first, second and third digital audio bus interfaces; and wherein
the first digital audio interface is coupled to a communications processor for processing a telephony call and the second digital audio interface is coupled to an applications processor for processing digital audio signals, and the third digital interface is coupled to a wireless codec for communication with a wireless peripheral device.

2. A digital audio device according to claim 1, wherein the audio codec further comprises a digital sample rate converter arranged to be coupled to an input of the adder.

3. A digital audio device according to claim 1, wherein the audio codec further comprises an analogue signal path for processing a received digital audio signal, the analogue signal path comprising a digital-to-analogue converter coupled to an analogue-to-digital converter, the digital-to-analogue converter and the analogue-to-digital converter being operable at a different sample rates from each other in order to implement sample rate conversion of one of the received digital audio signals.

4. A digital audio device according to claim 3, wherein said adder comprises a digital mixer coupled to the output of the analogue-to-digital converter.

5. A digital audio device according to claim 1, wherein the adder comprises an analogue signal adder, and a digital-to-analogue converter is arranged to be coupled between each of said first and second digital audio bus interfaces and a respective input of the analogue signal adder, and an analogue-to-digital converter is arranged to be coupled to the output of the analogue signal adder.

6. A portable wireless telephony device comprising a digital audio device according to claim 1.

7. A method of operating a digital audio device, wherein the digital audio device comprises an audio codec suitable for converting digital audio signals to analogue audio signals,
wherein the audio codec comprises first, second and third digital audio bus interfaces for coupling to respective bidirectional digital audio buses or bus sections, and a plurality of circuit elements including a digital-to-analogue converter, an analogue-to-digital converter, and an adder, and a switching system,
and wherein the first digital audio bus interface is coupled to a communications processor for processing a telephony call and the second digital audio bus interface is coupled to an applications processor for processing digital audio signals, and the third digital bus interface is coupled to a wireless codec for communication with a wireless peripheral device,
the method comprising controlling the switching system to couple an audio signal from the first digital audio bus interface and an audio signal from the second digital audio bus interface to the adder, adding the audio signals together to form a combined audio signal, and transmitting the combined audio signal from one of said first, second and third digital audio bus interfaces.

8. A method according to claim 7, comprising transmitting the added-together digital audio signal to one of said first and second digital audio bus interfaces.

9. A method according to claim 7, comprising transmitting the added-together digital audio signal to the third digital audio bus interface.

10. A method according to claim 7, wherein the digital audio signals are added together digitally.

11. A method according to claim 10, wherein the sample rate of one of the digital audio signals is converted before it is added with the other of the digital audio signals.

12. A method according to claim 11, wherein the sample rate is converted digitally.

13. A method according to claim 11, wherein the sample rate is converted by converting the digital audio signal to analogue followed converting it from analogue back to digital at a different sample rate.

14. A method according to claim 7, wherein each of the received digital audio signals is converted to analogue, the signals are added together in analogue form, and the analogue added-together signal is converted to digital.

15. A method according to claim 7, in which one of the digital audio signals is a telephony signal and the other is a recorded audio signal.

16. A method of operating a digital audio device,
wherein the digital audio device comprises an audio codec suitable for converting digital audio signals to analogue audio signals, a communications processor for processing a telephony call, an applications processor for processing digital audio signals, and a wireless codec for communication with a wireless peripheral device,
the method comprising controlling the audio codec so as to receive a first digital audio signal over a first bidirectional bus or bus section from the communications processor, receive a second digital audio signal over a second bidirectional bus or bus section from the applications processor, form an added-together digital audio signal by adding together the first and second digital audio signals, and transmit the added-together digital audio signal over a third bidirectional bus or bus section to the wireless codec.

17. A method according to claim 16, wherein the first and second digital audio signals are added together digitally.

18. A method according to claim 17, wherein the sample rate of one of the first and second digital audio signals is converted before it is added with the other of the first and second digital audio signals.

19. A method according to claim 18, wherein the sample rate is converted digitally.

20. A method according to claim 18, wherein the sample rate is converted by converting the digital audio signal to analogue followed converting it from analogue back to digital at a different sample rate.

21. A method according to claim 16, wherein each of the first and second digital audio signals is converted to analogue, the signals are added together in analogue form, and the analogue added-together signal is converted to digital.

22. A method according to claim 16, in which one of the digital audio signals is a telephony signal and the other is a recorded audio signal.

23. A cellular wireless telephone comprising:
a communications processor for processing a telephony call;
an applications processor for processing digital audio signals;
a wireless codec for wirelessly communicating audio data with a wireless peripheral device;
an audio codec for converting digital audio signals to analog audio signals, the audio codec; and
first, second and third duplex digital audio buses or bus sections,
wherein the audio codec comprises:
first, second and third duplex digital audio bus interfaces for coupling to circuits via respective ones of said duplex digital audio buses or bus sections; and
an adder connectable to receive a first audio signal received in digital form by one of the first and second digital audio bus interfaces, to receive a second audio signal received in digital form by the other of the first and second digital audio bus interfaces, to add the first and second audio signals together to form an added-together audio signal,
wherein the first duplex digital audio bus or bus section is coupled between the first duplex digital audio bus interface and the applications processor, the second duplex digital audio bus or bus section is coupled between the second duplex digital audio bus interface and the communications processor, and the third duplex digital audio bus or bus section is coupled between the third duplex digital audio bus interface and the wireless codec,
and wherein the audio codec further comprises circuitry to provide the added-together audio signal in digital form to one of the first to third digital audio bus interfaces for transmission therefrom to a respective one of said communications processor, said applications processor and said wireless codec via a respective one of said first to third duplex digital audio buses or bus sections.

24. A method of operating a cellular wireless telephone, said cellular wireless telephone comprising an audio codec suitable for converting digital audio signals to analog audio signals, a communications processor for processing a telephony call, an applications processor for processing digital audio signals, a wireless codec for wirelessly communicating audio data with a wireless peripheral device, and first to third duplex digital audio buses or bus sections,
wherein the audio codec comprises: first to third digital audio bus interfaces; and a plurality of circuit elements including a digital-to-analog converter, an analog-to-digital converter and an adder; and switching means controllable to couple a selected one or ones of the circuit elements between the digital audio bus interfaces,
and wherein the first duplex digital audio bus or bus section is coupled between the first duplex digital audio bus interface and the applications processor, the second duplex digital audio bus or bus section is coupled between the second duplex digital audio bus interface and the communications processor, and the third duplex digital audio bus or bus section is coupled between the third duplex digital audio bus interface and the wireless codec,
the method comprising controlling the switching means so as to provide a signal path for audio signals from each of the first and second digital audio bus interfaces to the adder, adding audio signals received at the adder from respective ones of the first and second digital audio bus interfaces to provide an added-together audio signal, and controlling the switching means so as to provide a signal path for the added-together audio signal from the adder to one of the first to third digital audio bus interfaces.

* * * * *